United States Patent
Saplakoglu

(10) Patent No.: US 11,240,601 B1
(45) Date of Patent: Feb. 1, 2022

(54) ADAPTIVE HOWLING SUPPRESSOR

(71) Applicant: Amazon Technologies, Inc., Seattle, WA (US)

(72) Inventor: Gurhan Saplakoglu, Acton, MA (US)

(73) Assignee: Amazon Technologies, Inc, Seattle, WA (US)

( * ) Notice: Subject to any disclaimer, the term of this patent is extended or adjusted under 35 U.S.C. 154(b) by 0 days.

(21) Appl. No.: 17/112,006

(22) Filed: Dec. 4, 2020

(51) Int. Cl.
*H04R 3/02* (2006.01)
*H03G 3/30* (2006.01)
*G10L 25/51* (2013.01)

(52) U.S. Cl.
CPC ............... *H04R 3/02* (2013.01); *G10L 25/51* (2013.01); *H03G 3/3005* (2013.01)

(58) Field of Classification Search
USPC .......... 381/83, 93, 94.1, 94.3, 318, 354, 402
See application file for complete search history.

(56) References Cited

U.S. PATENT DOCUMENTS 7,092,532 B2 * 8/2006 Luo .................. H04R 3/02 381/107
8,917,892 B2 * 12/2014 Poe .................. H04R 25/70 381/318

* cited by examiner

Primary Examiner — Yosef K Laekemariam
(74) Attorney, Agent, or Firm — Pierce Atwood LLP

(57) ABSTRACT

A system configured to perform adaptive feedback reduction, such as howling suppression, to prevent feedback from occurring when two devices are acoustically coupled during a communication session. To reduce feedback between the acoustically coupled devices, a device monitors input audio data from a microphone and determines whether feedback is present in individual frequency subbands. For example, the device determines an expected value for a first subband using neighboring subbands (e.g., averaging subbands surrounding the first subband) and compares the expected value to an actual value for the first subband. If the actual value is noticeably higher than the expected value, the device determines that feedback is present in the first subband and attenuates the first subband. If the feedback is not present, the device passes the first subband without attenuation.

20 Claims, 20 Drawing Sheets

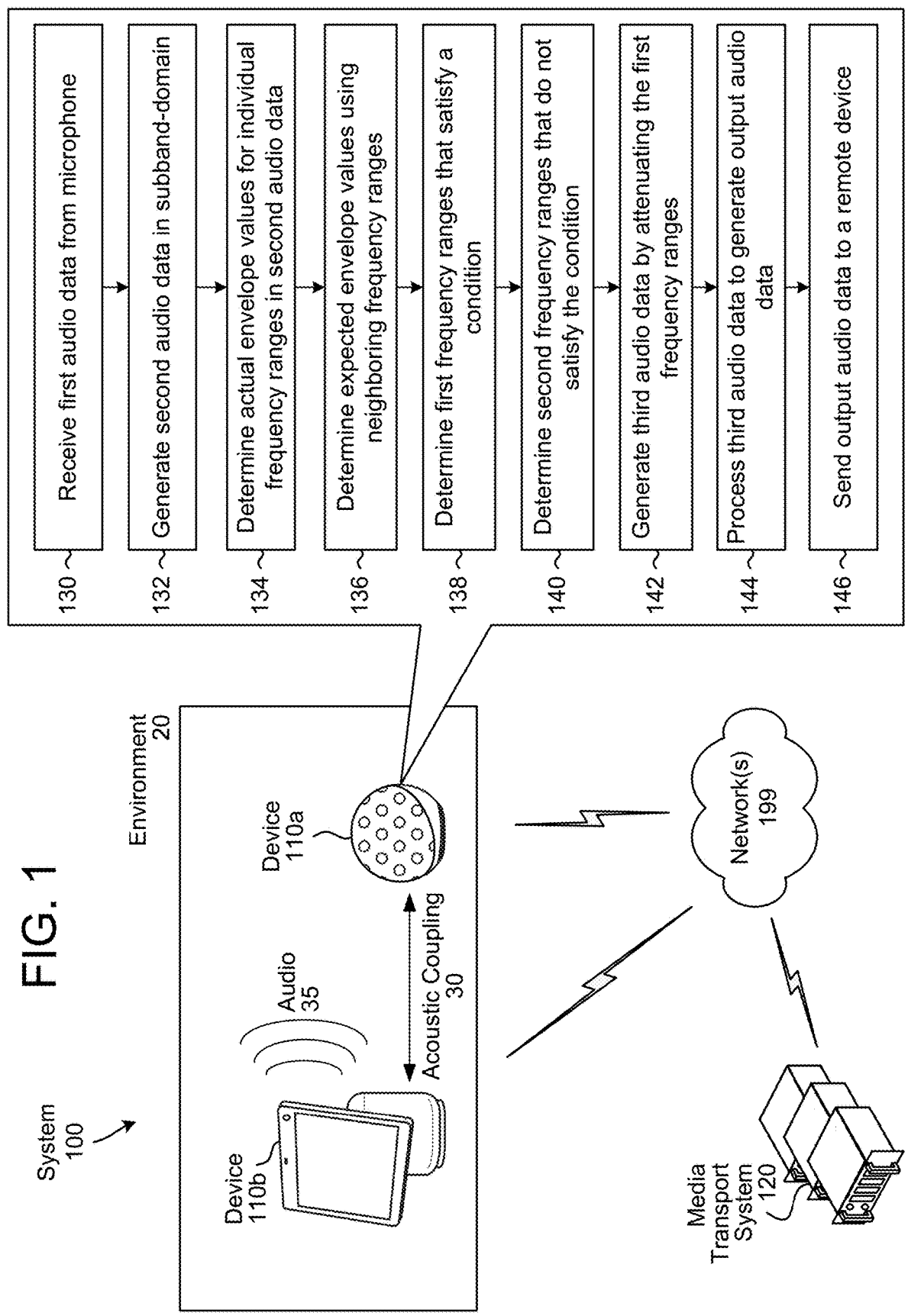

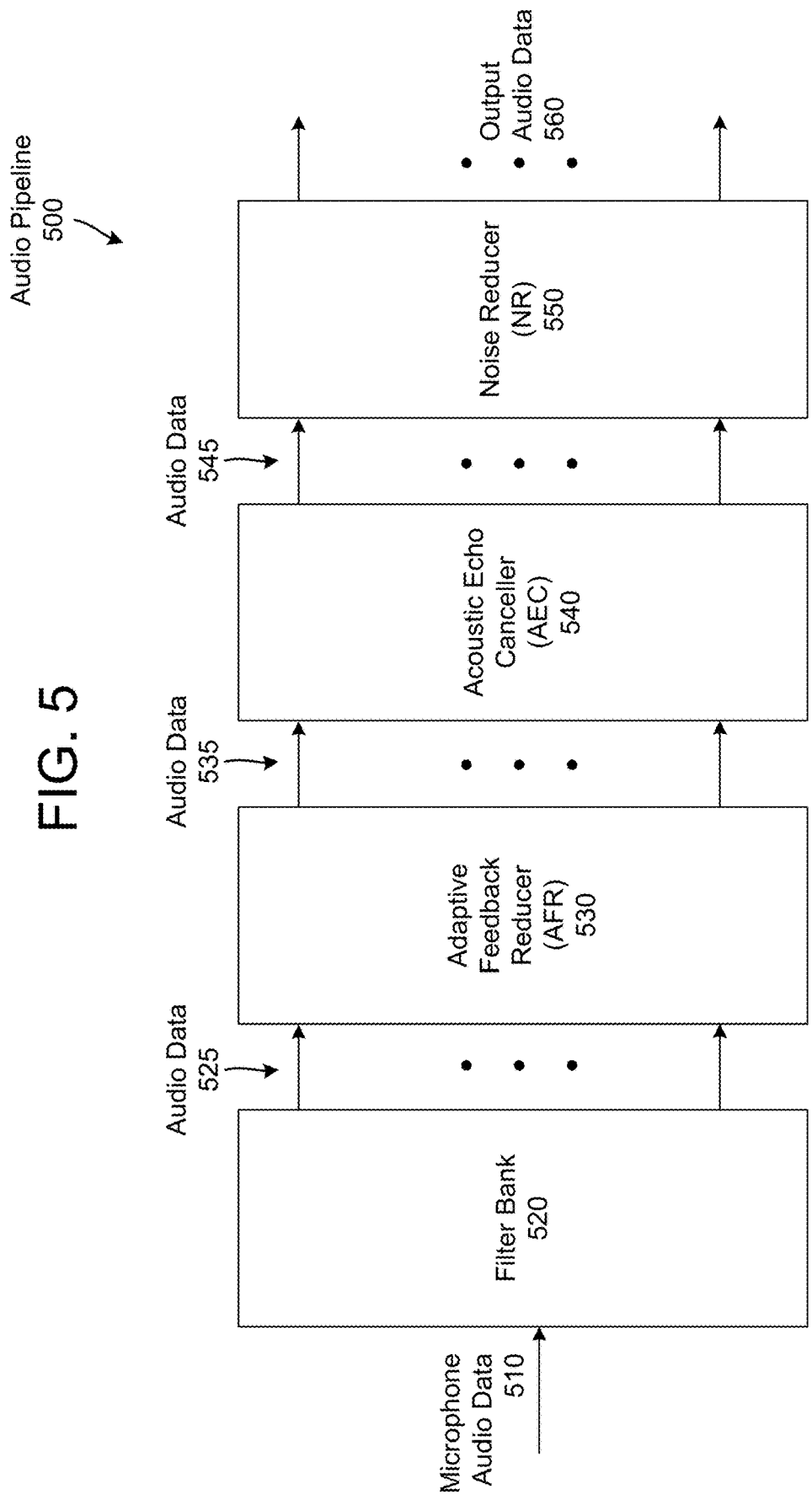

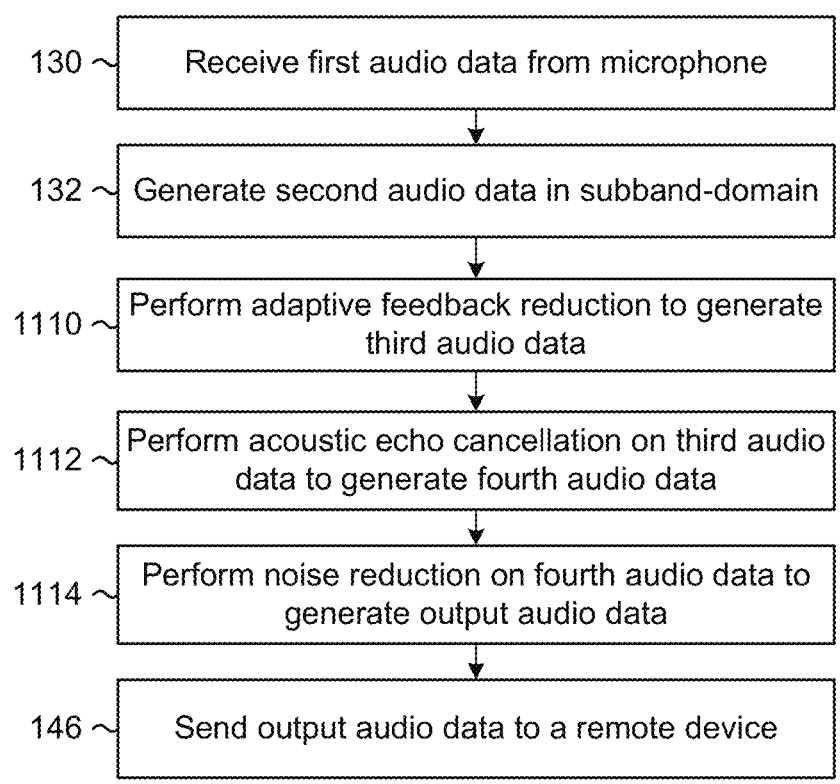

ADAPTIVE HOWLING SUPPRESSOR

BACKGROUND

With the advancement of technology, the use and popularity of electronic devices has increased considerably. Electronic devices are commonly used to capture and process audio data.

BRIEF DESCRIPTION OF DRAWINGS

For a more complete understanding of the present disclosure, reference is now made to the following description taken in conjunction with the accompanying drawings.

FIG. 1 illustrates a system for performing adaptive howling suppression according to embodiments of the present disclosure.

FIG. 5 illustrates an example component diagram for performing adaptive feedback reduction within an audio pipeline according to embodiments of the present disclosure.

FIG. 11 is a flowchart conceptually illustrating an example method for generating output audio according to embodiments of the present disclosure.

DETAILED DESCRIPTION

Figure 2A:
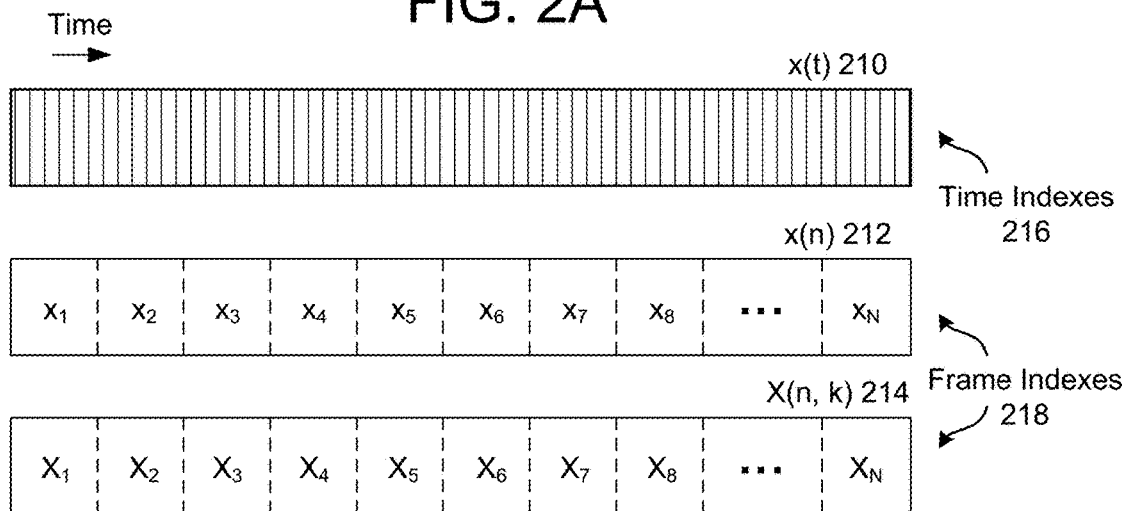
FIGS. 2A-2D illustrate examples of frame indexes, tone indexes, and channel indexes.

Electronic devices may be used to capture and/or process audio data as well as output audio represented in the audio data. During a communication session between a first device and a second device, such as a Voice over Internet Protocol (VoIP) communication session, the first device may capture first audio data and send the first audio data to the second device for playback, and the second device may use the first audio data to generate first audio. If the first device and the second device are located in proximity to each other, they may be acoustically coupled. This results in a feedback loop that causes the first audio to grow uncontrollably loud, negatively affecting a user experience until the devices are manually muted.

To improve a user experience during a communication session, devices, systems and methods are disclosed that perform adaptive feedback reduction (e.g., howling suppression). To suppress howling, a device monitors input audio data from a microphone and determines whether feedback is present in individual frequency subbands. For example, the device determines an expected value (e.g., estimated value) for a first subband using neighboring subbands (e.g., by averaging subbands surrounding the first subband) and compares the expected value to an actual value for the first subband. If the actual value is noticeably higher than the expected value, the device determines that howling is represented in the first subband and attenuates the first subband. If howling is not present, the device passes the first subband without attenuation FIG. 1 illustrates a high-level conceptual block diagram of a system 100 configured to perform adaptive feedback reduction according to embodiments of the disclosure. Although FIG. 1 and other figures/discussion illustrate the operation of the system in a particular order, the steps described may be performed in a different order (as well as certain steps removed or added) without departing from the intent of the disclosure. As illustrated in FIG. 1, the system 100 may include a first device 110a, a second device 110b, and/or a media transport system 120 that may be communicatively coupled to network(s) 199. For example, the media transport system 120 may be configured to enable a communication session between the first device 110a and the second device 110b, although the disclosure is not limited thereto.

As used herein, the communication session may correspond to a Voice over Internet Protocol (VoIP) communication session, although the disclosure is not limited thereto. If the first device 110a is in physical proximity to the second device 110b, the first device 110a may become acoustically coupled to the second device 110b during the communication session. For example, FIG. 1 illustrates an example in which the first device 110a and the second device 110b are located in proximity to one another within an environment 20. Due to this proximity, the first device 110a may recapture a portion of audio 35 output by the second device 110b, which results in acoustic coupling 30. This acoustic coupling may create a feedback loop that causes output audio to grow uncontrollably loud, negatively affecting a user experience until the devices 110a/110b are manually muted.

To improve a user experience, the system 100 may be configured to perform adaptive feedback reduction processing to suppress feedback (e.g., howling suppression). As described in greater detail below with regard to FIG. 5, the first device 110a may generate first audio data using a microphone and may process the first audio data using an adaptive feedback reducer component to generate second audio data. For example, the adaptive feedback reducer component may be configured to detect feedback present in the first audio data and attenuate the feedback to generate the second audio data. Thus, the first device 110a may perform howling suppression prior to sending the second audio data to the second device 110b.

In some examples, the second device 110b may also include an adaptive feedback reducer component, although the disclosure is not limited thereto. Additionally or alternatively, the media transport system 120 may include an adaptive feedback reducer component without departing from the disclosure. For example, while the following description refers to the adaptive feedback reducer component being included within an audio pipeline of the device 110, the disclosure is not limited thereto and the adaptive feedback reducer component may be included within an audio pipeline of the media transport system 120. Thus, the media transport system 120 may optionally perform howling suppression in order to suppress feedback for devices that are not configured to perform howling suppression without departing from the disclosure.

As illustrated in FIG. 1, the first device 110a may receive (130) first audio data from a microphone and may generate (132) second audio data in a subband-domain. For example, the first device 110a may include a plurality of bandpass filters and may be configured to convert the first audio data in a time-domain to the second audio data in the subband-domain, as described in greater detail below.

The first device 110a may determine (134) actual envelope values for individual frequency ranges in the second audio data (e.g., individual subbands) and may determine (136) expected envelope values using neighboring frequency ranges. For example, the first device 110a may use the actual envelope values for neighboring frequency ranges surrounding a selected frequency range to estimate the expected envelope value for the selected frequency range, as described in greater detail below with regard to FIG. 6.

Using the actual envelope values and the expected envelope values, the first device 110a may determine (138) first frequency ranges that satisfy a condition and may determine (140) second frequency ranges that do not satisfy the condition. For example, the first device 110a may detect feedback within the first frequency ranges and may select corresponding gain values to attenuate the first frequency ranges. Thus, the first device 110a may generate (142) third audio data by attenuating the first frequency ranges, may process (144) the third audio data to generate output audio data, and may send (146) the output audio data to a remote device (e.g., the second device 110b) as part of the communication session.

While not illustrated in FIG. 1, in some examples the system 100 may attenuate neighboring frequency ranges without departing from the disclosure. For example, if the first device 110a determines to attenuate a fifth subband $k_5$, the first device 110a may also attenuate a fourth subband $k_4$, a sixth subband $k_6$, and/or additional subbands. To illustrate an example, the first device 110a may determine third frequency ranges in which howling is present and may determine the first frequency ranges by including the third frequency ranges and any neighboring frequency ranges that are separated from the third frequency ranges by less than a first number of subbands, although the disclosure is not limited thereto.

An audio signal is a representation of sound and an electronic representation of an audio signal may be referred to as audio data, which may be analog and/or digital without departing from the disclosure. For ease of illustration, the disclosure may refer to either audio data (e.g., microphone audio data, input audio data, etc.) or audio signals (e.g., microphone signal, input audio signal, etc.) without departing from the disclosure. Additionally or alternatively, portions of a signal may be referenced as a portion of the signal or as a separate signal and/or portions of audio data may be referenced as a portion of the audio data or as separate audio data. For example, a first audio signal may correspond to a first period of time (e.g., 30 seconds) and a portion of the first audio signal corresponding to a second period of time (e.g., 1 second) may be referred to as a first portion of the first audio signal or as a second audio signal without departing from the disclosure. Similarly, first audio data may correspond to the first period of time (e.g., 30 seconds) and a portion of the first audio data corresponding to the second period of time (e.g., 1 second) may be referred to as a first portion of the first audio data or second audio data without departing from the disclosure. Audio signals and audio data may be used interchangeably, as well; a first audio signal may correspond to the first period of time (e.g., 30 seconds) and a portion of the first audio signal corresponding to a second period of time (e.g., 1 second) may be referred to as first audio data without departing from the disclosure.

In some examples, the audio data may correspond to audio signals in a time-domain. However, the disclosure is not limited thereto and the device 110 may convert these signals to a subband-domain or a frequency-domain prior to performing additional processing, such as adaptive feedback reduction (AFR) processing, acoustic echo cancellation (AEC), noise reduction (NR) processing, tap detection, and/or the like. For example, the device 110 may convert the time-domain signal to the subband-domain by applying a bandpass filter or other filtering to select a portion of the time-domain signal within a desired frequency range. Additionally or alternatively, the device 110 may convert the time-domain signal to the frequency-domain using a Fast Fourier Transform (FFT) and/or the like.

As used herein, audio signals or audio data (e.g., microphone audio data, or the like) may correspond to a specific range of frequency bands. For example, the audio data may correspond to a human hearing range (e.g., 20 Hz-20 kHz), although the disclosure is not limited thereto.

As used herein, a frequency band (e.g., frequency bin) corresponds to a frequency range having a starting frequency and an ending frequency. Thus, the total frequency range may be divided into a fixed number (e.g., 256, 512, etc.) of frequency ranges, with each frequency range referred to as a frequency band and corresponding to a uniform size. However, the disclosure is not limited thereto and the size of the frequency band may vary without departing from the disclosure.

FIGS. 2A-2D illustrate examples of frame indexes, tone indexes, and channel indexes. As described above, the device 110 may generate microphone audio data $x_m(t)$ using microphone(s). For example, a first microphone may generate first microphone audio data $x_{m1}(t)$ in the time-domain, a second microphone may generate second microphone audio data $x_{m2}(t)$ in the time-domain, and so on. As illustrated in FIG. 2A, a time-domain signal may be represented as microphone audio data x(t) 210, which is comprised of a sequence of individual samples of audio data. Thus, x(t) denotes an individual sample that is associated with a time t.

While the microphone audio data x(t) 210 is comprised of a plurality of samples, in some examples the device 110 may group a plurality of samples and process them together. As illustrated in FIG. 2A, the device 110 may group a number of samples together in a frame to generate microphone audio data x(n) 212. As used herein, a variable x(n) corresponds to the time-domain signal and identifies an individual frame (e.g., fixed number of samples s) associated with a frame index n.

In some examples, the device 110 may convert microphone audio data x(t) 210 from the time-domain to the subband-domain. For example, the device 110 may use a plurality of bandpass filters to generate microphone audio data x(t, k) in the subband-domain, with an individual bandpass filter centered on a narrow frequency range. Thus, a first bandpass filter may output a first portion of the microphone audio data x(t) 210 as a first time-domain signal associated with a first subband (e.g., first frequency range), a second bandpass filter may output a second portion of the microphone audio data x(t) 210 as a time-domain signal associated with a second subband (e.g., second frequency range), and so on, such that the microphone audio data x(t, k) comprises a plurality of individual subband signals (e.g., subbands). As used herein, a variable x(t, k) corresponds to the subband-domain signal and identifies an individual sample associated with a particular time t and tone index k.

For ease of illustration, the previous description illustrates an example of converting microphone audio data x(t) 210 in the time-domain to microphone audio data x(t, k) in the subband-domain. However, the disclosure is not limited thereto, and the device 110 may convert microphone audio data x(n) 212 in the time-domain to microphone audio data x(n, k) the subband-domain without departing from the disclosure.

Additionally or alternatively, the device 110 may convert microphone audio data x(n) 212 from the time-domain to a frequency-domain. For example, the device 110 may perform Discrete Fourier Transforms (DFTs) (e.g., Fast Fourier transforms (FFTs), short-time Fourier Transforms (STFTs), and/or the like) to generate microphone audio data X(n, k) 214 in the frequency-domain. As used herein, a variable X(n, k) corresponds to the frequency-domain signal and identifies an individual frame associated with frame index n and tone index k. As illustrated in FIG. 2A, the microphone audio data x(t) 212 corresponds to time indexes 216, whereas the microphone audio data x(n) 212 and the microphone audio data X(n, k) 214 corresponds to frame indexes 218.

A Fast Fourier Transform (FFT) is a Fourier-related transform used to determine the sinusoidal frequency and phase content of a signal, and performing FFT produces a one-dimensional vector of complex numbers. This vector can be used to calculate a two-dimensional matrix of frequency magnitude versus frequency. In some examples, the system 100 may perform FFT on individual frames of audio data and generate a one-dimensional and/or a two-dimensional matrix corresponding to the microphone audio data X(n). However, the disclosure is not limited thereto and the system 100 may instead perform short-time Fourier transform (STFT) operations without departing from the disclosure. A short-time Fourier transform is a Fourier-related transform used to determine the sinusoidal frequency and phase content of local sections of a signal as it changes over time.

Using a Fourier transform, a sound wave such as music or human speech can be broken down into its component "tones" of different frequencies, each tone represented by a sine wave of a different amplitude and phase. Whereas a time-domain sound wave (e.g., a sinusoid) would ordinarily be represented by the amplitude of the wave over time, a frequency-domain representation of that same waveform comprises a plurality of discrete amplitude values, where each amplitude value is for a different tone or "bin." So, for example, if the sound wave consisted solely of a pure sinusoidal 1 kHz tone, then the frequency-domain representation would consist of a discrete amplitude spike in the bin containing 1 kHz, with the other bins at zero. In other words, each tone "k" is a frequency index (e.g., frequency bin).

FIG. 2A illustrates an example of time indexes 216 (e.g., microphone audio data x(t) 210) and frame indexes 218 (e.g., microphone audio data x(n) 212 in the time-domain and microphone audio data X(n, k) 216 in the frequency-domain). For example, the system 100 may apply FFT processing to the time-domain microphone audio data x(n) 212, producing the frequency-domain microphone audio data X(n,k) 214, where the tone index "k" (e.g., frequency index) ranges from 0 to K and "n" is a frame index ranging from 0 to N. As illustrated in FIG. 2A, the history of the values across iterations is provided by the frame index "n", which ranges from 1 to N and represents a series of samples over time.

Figure 2B:
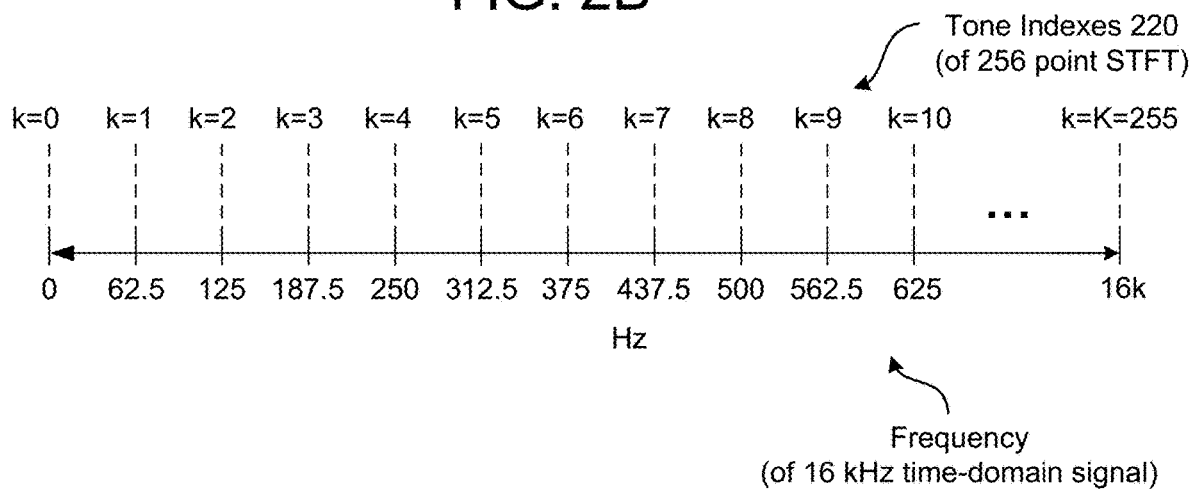

FIG. 2B illustrates an example of performing a K-point FFT on a time-domain signal. As illustrated in FIG. 2B, if a 256-point FFT is performed on a 16 kHz time-domain signal, the output is 256 complex numbers, where each complex number corresponds to a value at a frequency in increments of 16 kHz/256, such that there is 125 Hz between points, with point 0 corresponding to 0 Hz and point 255 corresponding to 16 kHz. As illustrated in FIG. 2B, each tone index 220 in the 256-point FFT corresponds to a frequency range (e.g., subband) in the 16 kHz time-domain signal. While FIG. 2B illustrates the frequency range being divided into 256 different frequency ranges (e.g., tone indexes), the disclosure is not limited thereto and the system 100 may divide the frequency range into K different frequency ranges (e.g., K indicates an FFT size). While FIG. 2B illustrates the tone index 220 being generated using a Fast Fourier Transform (FFT), the disclosure is not limited thereto. Instead, the tone index 220 may be generated using Short-Time Fourier Transform (STFT), generalized Discrete Fourier Transform (DFT) and/or other transforms known to one of skill in the art (e.g., discrete cosine transform, non-uniform filter bank, etc.).

Figure 2C:
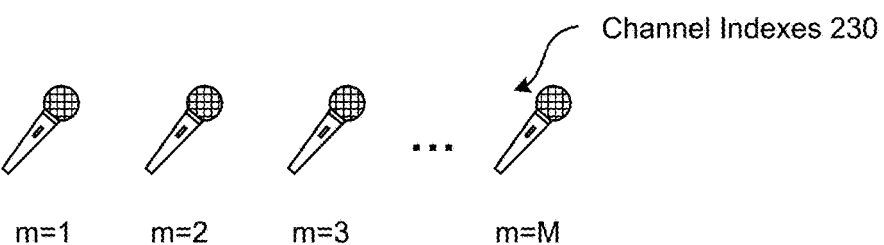

The system 100 may include multiple microphone(s), with a first channel m corresponding to a first microphone (e.g., m=1), a second channel (m+1) corresponding to a second microphone (e.g., m=2), and so on until a final channel (M) that corresponds to final microphone (e.g., m=M). FIG. 2C illustrates channel indexes 230 including a plurality of channels from channel m=1 to channel m=M. While an individual device 110 may include multiple microphone(s), during a communication session the device 110 may select a single microphone and generate microphone audio data using the single microphone. However, while many drawings illustrate a single channel (e.g., one microphone), the disclosure is not limited thereto and the number of channels may vary. For the purposes of discussion, an example of system 100 may include "M" microphones (M>1) for hands free near-end/far-end distant speech recognition applications.

While FIGS. 2A-2D are described with reference to the microphone audio data $x_m(t)$, the disclosure is not limited thereto and the same techniques apply to the playback audio data $x_r(t)$ without departing from the disclosure. Thus, playback audio data $x_r(t)$ indicates a specific time index t from a series of samples in the time-domain, playback audio data $x_r(n)$ indicates a specific frame index n from series of frames in the time-domain, and playback audio data $X_r(n, k)$ indicates a specific frame index n and frequency index k from a series of frames in the frequency-domain.

Prior to converting the microphone audio data $x_m(n)$ and the playback audio data $x_r(n)$ to the frequency-domain, the device 110 may first perform time-alignment to align the playback audio data $x_r(n)$ with the microphone audio data $x_m(n)$. For example, due to nonlinearities and variable delays associated with sending the playback audio data $x_r(n)$ to loudspeaker(s) using a wired and/or wireless connection, the playback audio data $x_r(n)$ may not be synchronized with the microphone audio data $x_m(n)$. This lack of synchronization may be due to a propagation delay (e.g., fixed time delay) between the playback audio data $x_r(n)$ and the microphone audio data $x_m(n)$, clock jitter and/or clock skew (e.g., difference in sampling frequencies between the device 110 and the loudspeaker(s)), dropped packets (e.g., missing samples), and/or other variable delays.

To perform the time alignment, the device 110 may adjust the playback audio data $x_r(n)$ to match the microphone audio data $x_m(n)$. For example, the device 110 may adjust an offset between the playback audio data $x_r(n)$ and the microphone audio data $x_m(n)$ (e.g., adjust for propagation delay), may add/subtract samples and/or frames from the playback audio data $x_r(n)$ (e.g., adjust for drift), and/or the like. In some examples, the device 110 may modify both the microphone audio data $x_m(n)$ and the playback audio data $x_r(n)$ in order to synchronize the microphone audio data $x_m(n)$ and the playback audio data $x_r(n)$. However, performing nonlinear modifications to the microphone audio data $x_m(n)$ results in first microphone audio data $x_{m1}(n)$ associated with a first microphone to no longer be synchronized with second microphone audio data $x_{m2}(n)$ associated with a second microphone. Thus, the device 110 may instead modify only the playback audio data $x_r(n)$ so that the playback audio data $x_r(n)$ is synchronized with the first microphone audio data $x_{m1}(n)$.

While FIG. 2A illustrates the frame indexes 218 as a series of distinct audio frames, the disclosure is not limited thereto. In some examples, the device 110 may process overlapping audio frames and/or perform calculations using overlapping time windows without departing from the disclosure. For example, a first audio frame may overlap a second audio frame by a certain amount (e.g., 80%), such that variations between subsequent audio frames are reduced. Additionally or alternatively, the first audio frame and the second audio frame may be distinct without overlapping, but the device 110 may determine power value calculations using overlapping audio frames. For example, a first power value calculation associated with the first audio frame may be calculated using a first portion of audio data (e.g., first audio frame and n previous audio frames) corresponding to a fixed time window, while a second power calculation associated with the second audio frame may be calculated using a second portion of the audio data (e.g., second audio frame, first audio frame, and n−1 previous audio frames) corresponding to the fixed time window. Thus, subsequent power calculations include n overlapping audio frames.

Figure 2D:
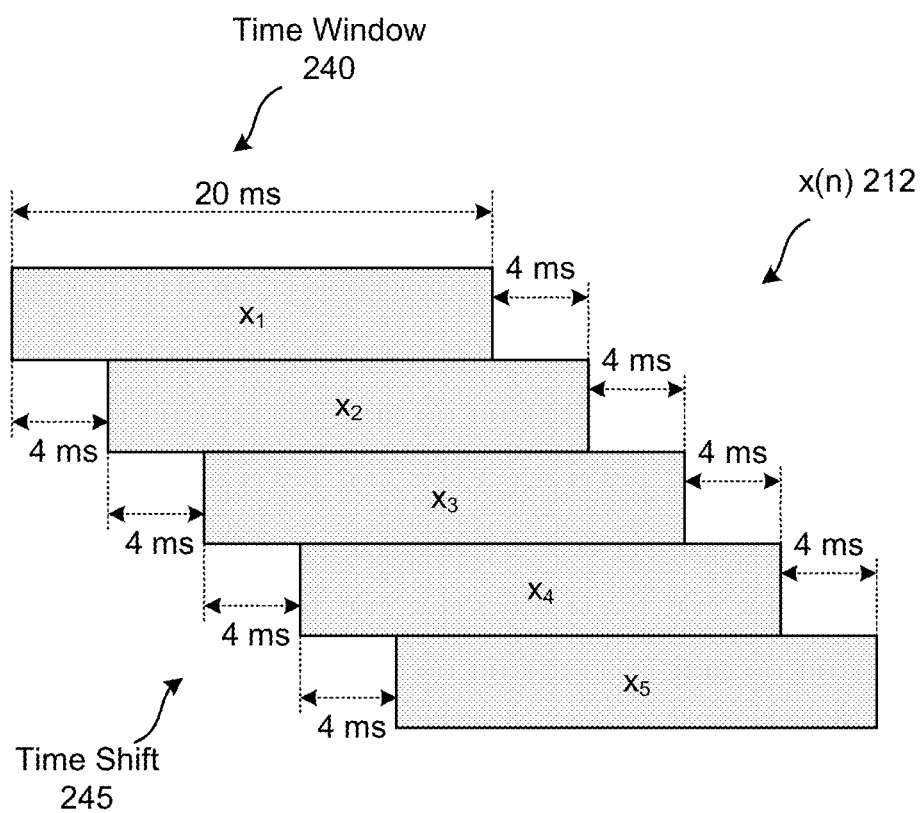

As illustrated in FIG. 2D, overlapping audio frames may be represented as overlapping audio data associated with a time window 240 (e.g., 20 ms) and a time shift 245 (e.g., 4 ms) between neighboring audio frames. For example, a first audio frame x1 may extend from 0 ms to 20 ms, a second audio frame x2 may extend from 4 ms to 24 ms, a third audio frame x3 may extend from 8 ms to 28 ms, and so on. Thus, the audio frames overlap by 80%, although the disclosure is not limited thereto and the time window 240 and the time shift 245 may vary without departing from the disclosure.

Figure 3A:
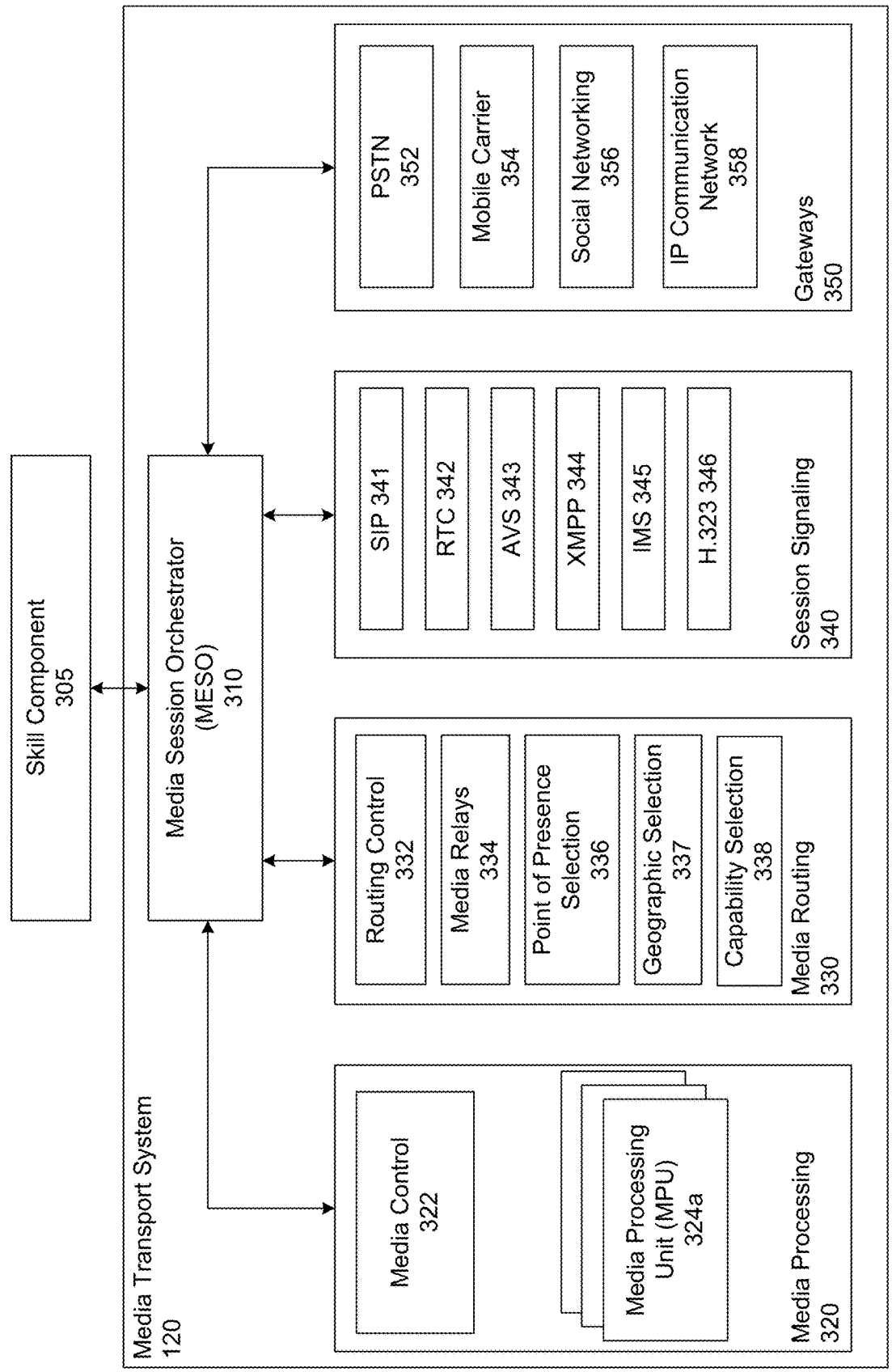
FIGS. 3A-3B illustrate example component diagrams of a media transport system configured to perform media processing according to embodiments of the present disclosure.
Figure 3B:
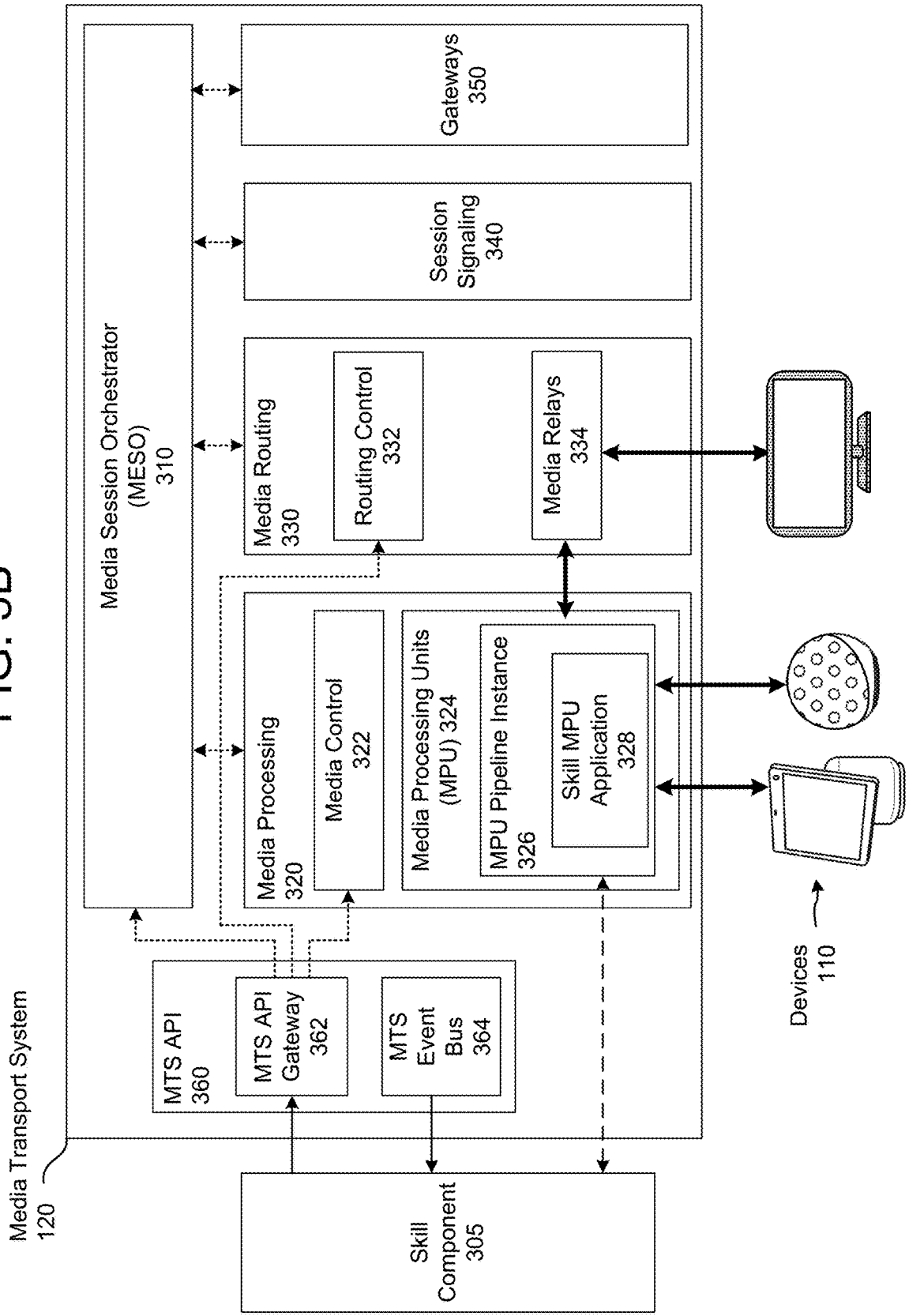

FIGS. 3A-3B illustrate example component diagrams of a media transport system configured to perform media processing according to embodiments of the present disclosure. As illustrated in FIG. 3A, a skill component 305 (e.g., specific skill configured to support communication sessions on the device 110) may interact with a media transport system 120 to request and utilize resources available within the media transport system 120. For example, the skill component 305 may correspond to an application (e.g., process, skill, and/or the like) running on a local device (e.g., device 110) and/or one or more servers, and the skill component 305 may enable a user 5 to interact with the media transport system 120 to initiate and manage a communication session involving media processing, although the disclosure is not limited thereto. To illustrate an example, the user 5 may input a command to an application programming interface (API) for the skill component 305 that is running on the device 110. The device 110 may send a request corresponding to the command to the one or more servers associated with the skill component 305 and the one or more servers may send the request to the media transport system 120.

In some examples, the skill component 305 may be developed (e.g., programmed) by an internal client or other development team (e.g., developer, programmer, and/or the like) to perform specific functionality. Thus, the skill component 305 may be designed to utilize specific resources available within the media transport system 120 and a finished product is made available to the public (e.g., end-user such as user 5). For example, the skill component 305 may enable the user 5 to initiate and/or participate in a communication session (e.g., group conference call, such as videoconferencing), to consume media content (e.g., streaming video data) with unique functionality or processing, and/or perform additional functionality (e.g., perform computer vision processing on image data, speech processing on audio data, machine learning, and/or the like) without departing from the disclosure. In this example, the media transport system 120 provides a simplified interface that enables the internal client to utilize resources within the skill component 305, but the interface and/or resources are not visible to and/or customizable by the end-user that uses the skill component 305.

The disclosure is not limited thereto, however, and in other examples the skill component 305 may be made available for external development to third party clients and/or to individual users. Thus, the media transport system 120 may provide a simplified interface for unique programming without technical expertise. For example, an individual user 5 may customize the skill component 305 using a drag and drop graphical user interface (GUI) to enable unique functionality, enabling the user 5 to program custom routines, skills, and/or the like. To illustrate an example, the user 5 may customize the skill component 305 to receive image data generated by an image sensor, process the image data using computer vision, and then perform specific action(s). For example, the skill component 305 may be programmed so that when a device (e.g., doorbell camera) detects motion and captures image data, the skill component 305 processes the image data using facial recognition to detect authorized users (e.g., family members or other invited guests) and either performs a first action (e.g., unlock the front door when an authorized user is detected) or performs a second action (e.g., send a notification to the user 5 including image data representing an unauthorized user). Thus, the interface and/or resources associated with the media transport system 120 may be visible to and/or customizable by the end-user that uses the skill component 305 without departing from the disclosure.

To enable the skill component 305 to request and utilize resources from within the media transport system 120, the media transport system 120 may include a media session orchestrator (MESO) component 310 configured to coordinate (e.g., define, establish, manage, etc.) a communication session (e.g., media session).

As illustrated in FIG. 3A, the MESO component 310 may interface between components that fall within four distinct categories: media processing components 320, media routing components 330, session signaling components 340, and/or gateway components 350.

Media processing components 320 refers to processing media content to enable unique functionality. For example, the media transport system 120 may provide a hosted back-end that performs media processing on individual streams of data, enabling the skill component 305 to define and control how media content is processed by the media transport system 120. The media processing components 320 may correspond to real time processing (e.g., data is processed during run-time, such as while streaming video to a user 5, during a videoconference, and/or the like) or offline processing (e.g., data is processed and stored in a database for future requests, such as during batch processing) without departing from the disclosure.

The media processing components 320 may include at least one media control component 322 and/or at least one media processing unit (MPU) 324 (e.g., first MPU 324a, second MPU 324b, etc.). The media control component 322 may coordinate media processing by sending control data to and/or receiving control data from other components within the media transport system 120. For example, the MESO component 310 may send a request to the media control component 322 to launch a specific application (e.g., skill, process, etc.) to perform media processing and the media control component 322 may send an instruction to a corresponding MPU 324.

The MPU 324 may be configured to perform media processing to enable additional functionality. Thus, the MPU 324 may receive first data and process the first data to generate second data. As part of performing media processing, the MPU 324 may perform speech processing on audio data and/or image data, perform computer vision processing on image data, modify audio data and/or image data, apply visual effects (e.g., overlay or other graphical element(s)) to image data, and/or the like to enable interesting functionality without departing from the disclosure. For example, the MPU 324 may generate subtitles (e.g., text data) corresponding to speech represented in image data, may translate the subtitles to a different language, may perform text-to-speech processing to enable additional functionality (e.g., describing visual cues for someone that is visually impaired, replacing dialog with speech in a different language, etc.), may perform voice recognition to identify voices represented in audio data, may perform facial recognition to detect and/or identify faces represented in image data, may perform object recognition to detect and/or identify objects represented in image data, may add a graphical overlay to image data (e.g., censoring portions of the image data, adding symbols or cartoons to the image data, etc.), may perform other processing to media content (e.g., colorize black and white movies), and/or the like without departing from the disclosure.

In some examples, the media transport system 120 may perform media processing using two or more MPUs 324. For example, the media transport system 120 may perform first media processing using a first MPU 324a and perform second media processing using a second MPU 324b. To illustrate an example, a communication session may correspond to a video chat implementation that includes image data and audio data and the media transport system 120 may perform media processing in parallel. For example, the media transport system 120 may separate the image data and the audio data, performing first media processing on the image data and separately performing second media processing on the audio data, before combining the processed image data and the processed audio data to generate output data. However, the disclosure is not limited thereto, and in other examples the media transport system 120 may perform media processing in series without departing from the disclosure. For example, the media transport system 120 may process first image data using the first MPU 324a (e.g., first media processing) to generate second image data and may process the second image data using the second MPU 324b (e.g., second media processing) to generate output image data. Additionally or alternatively, the media transport system 120 may perform multiple media processing steps using a single MPU 324 (e.g., more complex media processing) without departing from the disclosure.

The media transport system 120 may include media routing components 330 that are configured to route media (e.g., send data packets) to and from the device(s) 110 via the network(s) 199. For example, the media routing components 330 may include one or more routing control components 332, media relay components 334, point of presence selection components 336, geographic selection components 337, and/or capability selection components 338. Examples of media relay components may include a Session Traversal of User Datagram Protocol (UDP) Through Network Address Translators (NATs) system (e.g., STUN system) and/or a Traversal Using relays around NAT (TURN) system, although the disclosure is not limited thereto. While FIG. 3A illustrates the media routing components 330 including the point of presence selection components 336, geographic selection components 337, and/or capability selection components 338 as separate components, this is for ease of illustration and the disclosure is not limited thereto. Instead, a single component may perform point of presence selection, geographic selection, and/or capability selection without departing from the disclosure.

In some examples, the media transport system 120 may separate the MPUs 324 from the network(s) 199 so that the MPUs 324 do not have a publicly accessible internet protocol (IP) address (e.g., cannot route outside of a local network). Thus, the system 100 may use the media relay components 334 to send the first data from a first device to the MPUs 324 and/or the second data (e.g., processed data) generated by the MPUs 324 from the MPUs 324 to a second device. For example, an individual device 110 may be associated with a specific TURN server, such that the system 100 may route data to and from the first device using a first TURN server and route data to and from the second device using a second TURN server.

While the example described above illustrates routing data to and from the media processing components 320, the media routing components 330 may be used to route data separately from the media processing components 320 without departing from the disclosure. For example, the system 100 may route data directly between devices 110 using one or more TURN servers (e.g., TURN system) without departing from the disclosure. Additionally or alternatively, the system 100 may route data using one or more STUN servers (e.g., STUN system), such as when a device 110 has a publicly accessible IP address. In some examples, the system may establish communication sessions using a combination of the STUN system and the TURN system without departing from the disclosure. For example, a communication session may be more easily established/configured using the TURN system, but may benefit from latency improvements using the STUN system. Thus, the system 100 may route data using the STUN system, the TURN system, and/or a combination thereof without departing from the disclosure.

In addition to routing data, the media routing components 330 also perform topology optimization. For example, the media routing components 330 may include geographically distributed media relay components (e.g., TURN/STUN servers) to enable the media transport system 120 to efficiently route the data packets. For example, the media routing components 330 may include a control plane that coordinates between the media relay components to select an optimum route (e.g., data path) to send the data packets. To illustrate an example, the media routing components 330 may determine a location of parties in a communication session and determine a data path that bypasses a particular country or chokepoint in the data network. In some examples, the media routing components 330 may select an enterprise specific route and only use specific connected links associated with the enterprise. Additionally or alternatively, the routing components 330 may apply machine learning models to further reduce latency by selecting the optimum route using non-geographical parameters (e.g., availability of servers, time of day, previous history, etc.).

While the description of the media relay components 334 refers to the STUN system and/or the TURN system, the disclosure is not limited thereto. Instead, the media routing components 330 may use any alternative systems known to one of skill in the art to route the data packets. For example, the media routing components 330 may use any technique that routes UDP data packets and allows the UDP data packets to traverse the NATs without departing from the disclosure. To illustrate an example, the media routing components 330 may include UDP packet forwarding and relay devices instead of the TURN system without departing from the disclosure.

The media transport system 120 may include session signaling components 340 (e.g., edge signaling, signaling network, etc.) that may be configured to coordinate signal paths (e.g., routing of data packets) and/or a type of data packets sent between the devices 110 and server(s) within the media transport system 120. For example, the session signaling components 340 may enable the devices 110 to coordinate with each other to determine how data packets are sent between the devices 110. In some examples, a signal path may correspond to a routing table that indicates a particular route or network addresses with which to route data between two devices, although the disclosure is not limited thereto. As illustrated in FIG. 3A, the session signaling components 340 may support protocols including Session Initiation Protocol (SIP) 341, Real-Time Communication (RTC) protocol 342 (e.g., WebRTC protocol), Alexa Voice Service (AVS) protocol 343 or other voice user interface protocols, Extensible Messaging and Presence Protocol (XMPP) 344, IP Multimedia Core Network Subsystem (IMS) 345, H.323 standard 346, and/or the like, although the disclosure is not limited thereto.

The media transport system 120 may include gateway components 350 that enable the media transport system 120 to interface with (e.g., send/receive media content or other data) external networks. As illustrated in FIG. 3A, the gateway components 350 may include a public switched telephone network (PSTN) gateway 352, a mobile carrier gateways 354, a social networking gateway 356, an IP communication network gateway 358, and/or other gateways known to one of skill in the art. While FIG. 3A illustrates the gateway components 350 including a single gateway for each external network, this is intended for illustrative purposes only and the gateway components 350 may include multiple gateways for each external network without departing from the disclosure. For example, the gateway components 350 may include multiple PSTN gateways 352 having different locations without departing from the disclosure. Additionally or alternatively, a single type of external network may correspond to multiple external networks without departing from the disclosure. For example, the gateway components 350 may include a first mobile carrier gateway 354 corresponding to a first mobile carrier network and a second mobile carrier gateway 354*b* corresponding to a second mobile carrier network without departing from the disclosure. However, the disclosure is not limited thereto and two or more mobile carrier networks may share a mobile carrier gateway 354 without departing from the disclosure.

To illustrate an example of using the gateway components 350, the system 100 may use the PSTN gateway 352 to establish a communication session with a PSTN device (e.g., wired/wireless telephone, cellular phone, and/or the like that is associated with a PSTN telephone number) using the PSTN. For example, the system 100 may use the session signaling components 340 to send SIP data packets from a device 110 to a PSTN gateway 352. The PSTN gateway 352 may receive the SIP data packets, convert the SIP data packets to audio data in a different format, and send the audio data to the PSTN device via the PSTN. Thus, the gateway components 350 may include a plurality of gateways, with each gateway being associated with a specific external network and configured to act as an interface between the media transport system 120 and the external network.

FIG. 3B illustrates an example of signal paths and data flow between components within the media transport system 120. As illustrated in FIG. 3B, the skill component 305 may send data to a media transport system (MTS) application programming interface (API) 360. The MTS API 360 may include an MTS API gateway component 362 that receives the data (e.g., request) and sends data to the MESO component 310, the media processing components 320, the media routing components 330, and/or other components. For example, FIG. 3B illustrates the MTS API gateway component 362 communicating with the MESO component 310, the media control component 322, and the routing control component 332.

As described above with regard to FIG. 3A, the MESO component 310 may communicate with the media processing components 320, the media routing components 330, the session signaling components 340, and/or the gateway components 350. Internal signaling within the media transport system 120 is represented in FIG. 3B as dotted lines.

The components within the media transport system 120 may process the request received from the MTS API gateway 362 and send data to the MTS API 360 in response to processing the request. For example, components within the media transport system 120 may send data to an MTS event bus 364 of the MTS API 360 and the MTS event bus 364 may send data (e.g., event, notification, etc.) to the skill component 305. Data sent as part of the MTS interface between the skill component 305 and the media transport system 120 is represented in FIG. 3B using a solid line.

As illustrated in FIG. 3B, the skill component 305 may communicate with the MPU 324. For example, the skill component 305 may communicate with an MPU pipeline instance 326 running within the MPU 324 that includes a skill MPU application 328. Thus, the skill component 305 may communicate directly with the skill MPU application as part of an application interface, which is represented as a dashed line in FIG. 3B. In addition to communicating with the skill component 305, the MPU pipeline instance 326 may send data (e.g., media content) to the devices 110, either directly or via the media relay components 334.

As used herein, an MPU pipeline instance or any other instance may refer to a specific component that is executing program code; all of the logic associated with the media processing unit is running in memory in a single host, which decreases latency associated with the media processing. For example, conventional techniques for executing asynchronous workflows perform checkpointing to store data in storage components between events. Thus, when a new event occurs, the conventional techniques retrieve the stored session and loads data into the memory, resulting in a large amount of latency. As part of reducing the latency, the media transport system 120 may use the MESO component 310 to route triggers and events directly to the MPU pipeline instance that is performing the media processing, enabling the media transport system 120 to perform media processing in real-time.

Using the MESO component 310, the media transport system 120 allows skills and/or applications to enable unique functionality without requiring the skill/application to independently develop and/or program the functionality. Thus, the media transport system 120 may offer media processing operations as a service to existing skills/applications. For example, the media transport system 120 may enable a skill to provide closed captioning or other features without building a closed captioning service. Instead, the media transport system 120 may route a communication session through an MPU 324 configured to perform closed captioning. Thus, an MPU 324 configured to enable a specific feature may be utilized to enable the feature on multiple skills without departing from the disclosure.

As the MESO component 310 is capable of executing requests and commands with low latency, the media transport system 120 may utilize multiple components within a single communication session. For example, the media transport system 120 may combine multiple different components (e.g., MPUs 324 associated with one or more skills) to piece together a custom implementation enabling a combination of existing features. To illustrate an example, the media transport system 120 may build back to back SIP user engine that is customizable for a specific implementation. Thus, the MESO component 310 may mix and match different components and/or features to provide a customized experience.

Figure 4A:
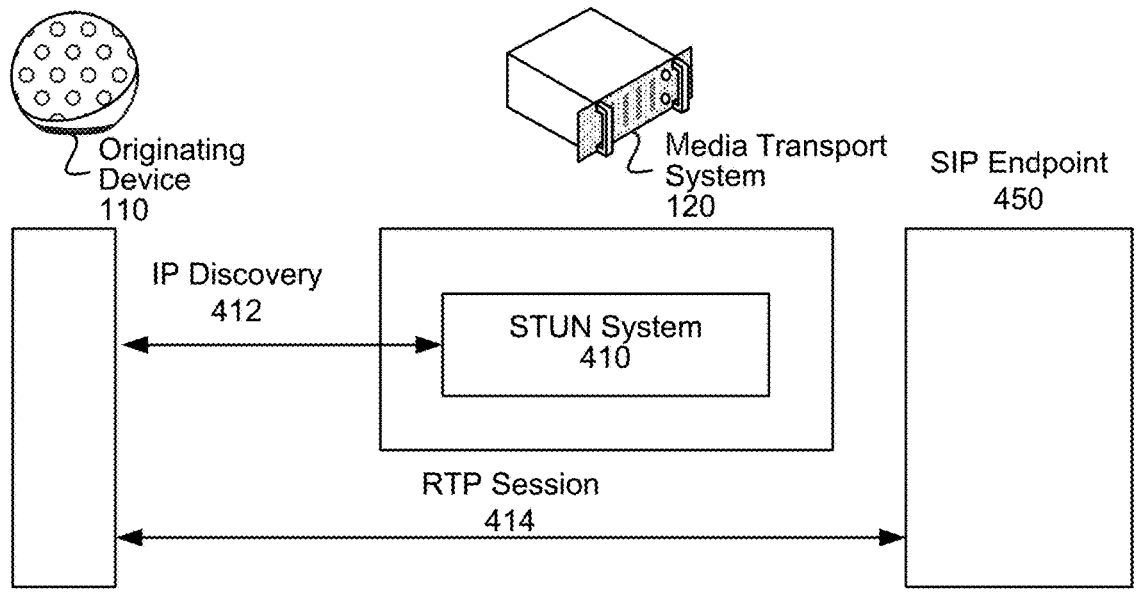
FIGS. 4A-4B illustrate examples of establishing media connections between devices according to embodiments of the present disclosure.
Figure 4B:
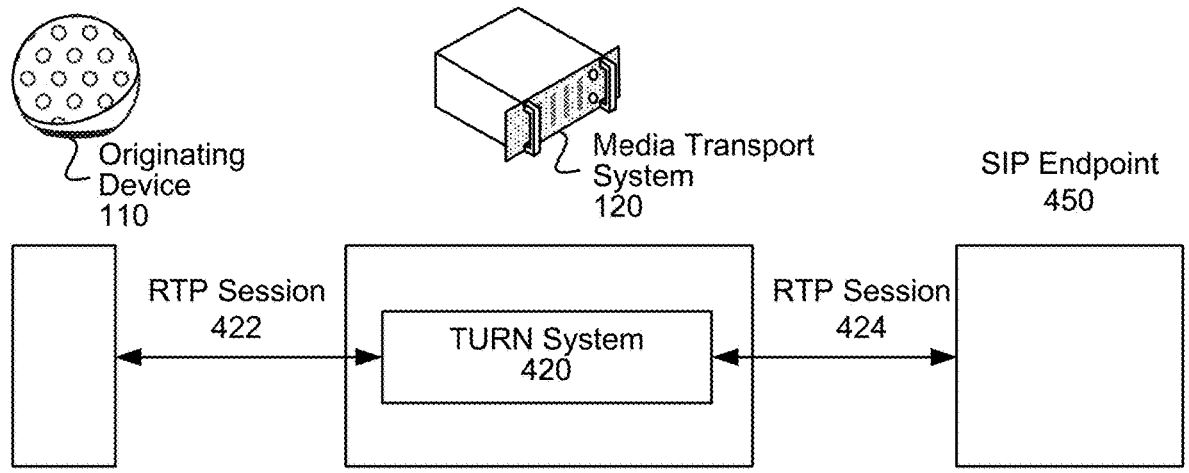

FIGS. 4A-4B illustrate examples of establishing media connections between devices according to embodiments of the present disclosure. In some examples, an originating device 110 may have a publicly accessible IP address and may be configured to establish a real-time transport (RTP) protocol communication session directly with a SIP endpoint 450. The SIP endpoint 450 may correspond to a device 110, a component within the media transport system 120, a gateway component configured to interface with a remote network, and/or a device associated with the remote network itself. To enable the originating device 110 to establish the RTP communication session, the media transport system 120 may include Session Traversal of User Datagram Protocol (UDP) Through Network Address Translators (NATs) system (e.g., STUN system 410). The STUN system 410 may be configured to allow NAT clients (e.g., an originating device 110 behind a firewall) to setup calls to a Voice over Internet Protocol (VoIP) provider hosted outside of the local network by providing a public IP address, the type of NAT they are behind, and a port identifier associated by the NAT with a particular local port. As illustrated in FIG. 4A, the originating device 110 may perform (412) IP discovery using the STUN system 410 and may use this information to set up an RTP communication session 414 (e.g., UDP communication) between the originating device 110 and the SIP endpoint 450 to establish a call.

In some examples, the originating device 110 may not have a publicly accessible IP address. For example, in some types of NAT the originating device 110 cannot route outside of the local network. To enable the originating device 110 to establish an RTP communication session, the media transport system 120 may include Traversal Using relays around NAT (TURN) system 420. The TURN system 420 may be configured to connect the originating device 110 to the SIP endpoint 450 when the originating device 110 is behind a NAT. As illustrated in FIG. 4B, the originating device 110 may establish (422) an RTP session with the TURN system 420 and the TURN system 420 may establish (424) an RTP session with the SIP endpoint 450. Thus, the originating device 110 may communicate with the SIP endpoint 450 via the TURN system 420. For example, the originating device 110 may send audio data and/or image data to the media transport system 120 and the media transport system 120 may send the audio data and/or the image data to the SIP endpoint 450. Similarly, the SIP endpoint 450 may send audio data and/or image data to the media transport system 120 and the media transport system 120 may send the audio data and/or the image data to the originating device 110.

In some examples, the system may establish communication sessions using a combination of the STUN system 410 and the TURN system 420 without departing from the disclosure. For example, a communication session may be more easily established/configured using the TURN system 420, but may benefit from latency improvements using the STUN system 410. Thus, the system may use the STUN system 410 when the communication session may be routed directly between two devices and may use the TURN system 420 for all other communication sessions. Additionally or alternatively, the system may use the STUN system 410 and/or the TURN system 420 selectively based on the communication session being established. For example, the system may use the STUN system 410 when establishing a communication session between two devices (e.g., point-to-point) within a single network (e.g., corporate LAN and/or WLAN), but may use the TURN system 420 when establishing a communication session between two devices on separate networks and/or three or more devices regardless of network(s).

When the communication session goes from only two devices to three or more devices, the system may need to transition from the STUN system 410 to the TURN system 420. Thus, if the system anticipates three or more devices being included in the communication session, the communication session may be performed using the TURN system 420. Similarly, when the communication session goes from three or more devices to only two devices, the system may need to transition from the TURN system 420 to the STUN system 410.

While FIGS. 4A-4B illustrate an RTP communication session being established between the originating device 110 and the SIP endpoint 450, the present disclosure is not limited thereto and the RTP communication session may be established between the originating device 110 and a gateway component or other device associated with the SIP endpoint 450 without departing from the present disclosure. Additionally or alternatively, while FIGS. 4A-4B illustrate examples of enabling communication sessions using the SIP protocol, the disclosure is not limited thereto and the media transport system 120 may use any protocols known to one of skill in the art.

While FIGS. 4A-4B illustrate examples of enabling communication sessions using a data connection (e.g., using Voice over Internet Protocol (VoIP), session initiation protocol (SIP), and/or the like), the disclosure is not limited thereto and the system 100 may enable communication sessions using any type of network without departing from the disclosure. For example, the media transport system 120 may enable communication sessions using a cellular connection (e.g., mobile phone network) or other external network without departing from the disclosure. For example, the media transport system 120 may send instructions (e.g., command data) to endpoints (e.g., caller devices, such as the device 110) instructing the endpoint to establish a communication session (e.g., dial a telephone number) in response to the voice command.

FIG. 5 illustrates an example component diagram for performing adaptive feedback reduction within an audio pipeline according to embodiments of the present disclosure. As illustrated in FIG. 5, during a communication session, such as a Voice over Internet Protocol (VoIP) communication session, an audio pipeline 500 may process microphone audio data 510 from a single microphone to generate output audio data 560 to send to a remote device. For example, the audio pipeline 500 may include a filter bank component 520, an adaptive feedback reducer (AFR) component 530, an acoustic echo canceller (AEC) component 540, and a noise reducer (NR) component 550, although the disclosure is not limited thereto and the audio pipeline 500 may include additional components not illustrated in FIG. 5.

The filter bank component 520 may receive the microphone audio data 510 generated by a single microphone and may be configured to generate audio data 525 by separating the microphone audio data 510 into a plurality of subband signals (e.g., individual frequency ranges and/or subbands). For example, the filter bank component 520 may include a plurality of bandpass filters, with an individual bandpass filter centered on a narrow frequency range, in order to convert the microphone audio data 510 from a time-domain to a subband-domain. Thus, a first bandpass filter may output a first portion of the microphone audio data 510 as a first time-domain signal associated with a first subband (e.g., first frequency range), a second bandpass filter may output a second portion of the microphone audio data 510 as a time-domain signal associated with a second subband (e.g., second frequency range), and so on, such that the audio data 525 comprises a plurality of individual subband signals.

For ease of illustration, the filter bank component 520 is described herein as converting the microphone audio data 510 from the time-domain to the subband-domain. However, the disclosure is not limited thereto and in some examples the filter bank component 520 may convert the microphone audio data 510 from the time-domain to a frequency-domain without departing from the disclosure. For example, the filter bank component 520 may perform Discrete Fourier Transforms (DFTs) (e.g., Fast Fourier transforms (FFTs), short-time Fourier Transforms (STFTs), and/or the like) to convert the microphone audio data 510 from the time-domain to the frequency-domain and generate the audio data 525. Representing the audio data 525 in the frequency-domain is similar to representing the audio data 525 in the subband-domain, as the audio data 525 would comprise a plurality of signals corresponding to individual frequency ranges, but instead of representing an individual subband as a time-domain signal the audio data 525 would represent an individual frequency range as a frequency-domain signal.

The AFR component 530 may receive the audio data 525 output by the filter bank component 520 (e.g., plurality of individual subband signals) and may be configured to perform adaptive feedback reduction (e.g., howling suppression) to generate audio data 535. For example, the AFR component 530 may monitor each of the individual subband signals to determine if feedback (e.g., howling) is represented within the subband (e.g., determine whether howling is present in the subband signal). If feedback is not detected in the subband, the AFR component 530 may pass the subband signal without attenuation (e.g., $g(k)=1$). However, if feedback is detected in the subband, the AFR component 530 may attenuate the subband signal to suppress the feedback (e.g., $g(k)=\lambda$). In some examples, the AFR component 530 may generate gain data indicating a gain value for each of the individual subband signals and may generate the audio data 535 by applying the gain data to the audio data 525 received from the filter bank component 520.

The AEC component 540 may receive the audio data 535 output by the AFR component 530 (e.g., a plurality of individual subband signals after howling suppression is performed) and may be configured to perform echo cancellation to generate audio data 545. For example, the AEC component 540 may determine a reference signal and may perform echo cancellation by subtracting the reference signal from the audio data 535 to generate the audio data 545.

In some examples, the reference signal may correspond to a playback audio data used to generate output audio during the communication session. For example, the device 110 may receive the playback audio data from the remote device and may generate output audio by sending the playback audio data to one or more loudspeaker(s). Thus, the AEC component 540 may receive the playback audio data and may use adaptive filters to generate the reference signal, which corresponds to an estimated echo signal represented in the microphone audio data 510.

However, the disclosure is not limited thereto and in other examples the AEC component 540 may perform echo cancellation using other techniques without departing from the disclosure. For example, the AEC component 540 may receive second microphone audio data generated by a second microphone and may generate a reference signal using the second microphone audio data without departing from the disclosure. Thus, the AEC component 540 may perform acoustic echo cancellation (AEC), adaptive interference cancellation (AIC) (e.g., acoustic interference cancellation), adaptive noise cancellation (ANC), and/or the like without departing from the disclosure.

The NR component 550 may receive the audio data 545 output by the AEC component 540 (e.g., a plurality of individual subband signals after echo cancellation is performed) and may be configured to perform noise reduction processing to generate output audio data 560. For example, the NR component 550 may perform noise reduction processing using any technique without departing from the disclosure.

While FIG. 5 illustrates an example of including the AFR component 530 at a first position within the audio pipeline 500, the disclosure is not limited thereto. Instead, the audio pipeline 500 may omit components illustrated in FIG. 5, may include additional components not illustrated in FIG. 5, and/or may rearrange the components within the audio pipeline 500 without departing from the disclosure. For example, the AFR component 530 may be positioned after the AEC component 540 and/or the NR component 550 without departing from the disclosure.

Figure 6:
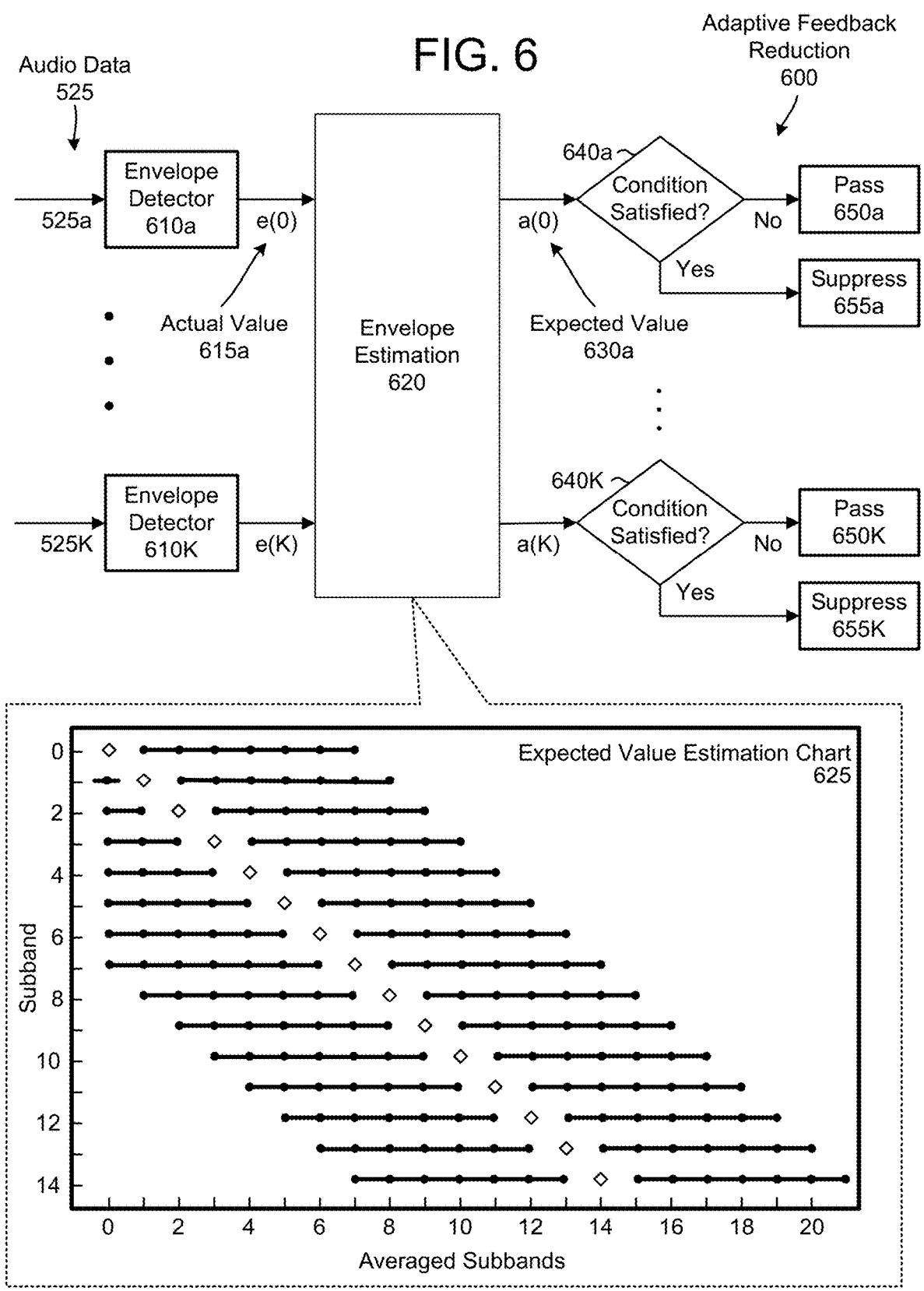
FIG. 6 illustrates an example component diagram for performing adaptive feedback reduction according to embodiments of the present disclosure.

FIG. 6 illustrates an example component diagram for performing adaptive feedback reduction according to embodiments of the present disclosure. As illustrated in FIG. 6, the device 110 may perform adaptive feedback reduction 600 to detect and attenuate feedback (e.g., howling) represented in the audio data 525. For example, the device 110 may determine an actual value of a first subband signal and an expected value for the first subband signal and determine whether feedback is represented by comparing the actual value to the expected value. If the actual value exceeds the expected value by a sufficient amount, the device 110 may determine that the first subband signal satisfies a condition and may suppress the first subband signal. In contrast, if the actual value does not exceed the expected value by a sufficient amount, the device 110 may determine that the first subband signal does not satisfy the condition and may pass the first subband signal without attenuation.

As illustrated in FIG. 6, the device 110 may perform a series of identical operations for each individual subband signal. For example, the device 110 may perform a first series of operations for a first subband signal (e.g., k=0), a second series of operations for a second subband signal (e.g., k=1), and so on until a final series of operations for a K-th subband signal (e.g., k=K). To illustrate an example, if the device 110 separates the microphone audio data 510 into 128 individual subband signals, then the subband signals range from a first subband signal (e.g., k=0) to a final subband signal (e.g., k=K=127), although the disclosure is not limited thereto. For ease of illustration, FIG. 6 only illustrates the first series of operations and the final series of operations, omitting the identical operations for each of the intervening subband signals.

As illustrated in FIG. 6, the device 110 may input a first portion of the audio data 525a (e.g., first subband signal) to a first envelope detector 610a, a second portion of the audio data 525b (e.g., second subband signal) to a second envelope detector 610b, and so on until a final portion of the audio data 525K (e.g., final subband signal) is input to a final envelope detector 610K. Each of the envelope detectors (610a, 610b, . . . 610K) may be configured to determine one of the actual values e(k) (615a, 615b, . . . 615K) using a desired attack rate and desired decay rate.

The envelope detector 610 may be configured to continuously track a power of the audio data to determine an amplitude envelope using conventional techniques, such as a leaky integrator algorithm. For example, the envelope detector 610 may receive a portion of the audio data (e.g., hundreds of audio samples) and may use a series of values representing the portion of the audio data to determine a first power value, such as a root mean square (RMS) power value. The first power value corresponds to an instantaneous power value, which represents a current power level of the audio data for a specific unit of time (e.g., n audio samples). By tracking instantaneous power values over time, the envelope detector 610 may use a first order filter (e.g., leaky integrator) to generate a smoothed power signal.

The envelope detector 610 may generate the smoothed power signal differently based on whether the audio data is rising or falling. When the audio data is rising (e.g., attack situation), the envelope detector 610 may increase the smoothed power signal using the instantaneous power value and the desired attack rate (e.g., attack time, attack gain coefficient, etc.). For example, if a first power value $p_1$ exceeds a first actual value $e_1$, the envelope detector 610 may increase the first actual value $e_1$ based on the first power value $p_1$ and an attack gain coefficient $g_a$. In some examples, the envelope detector 610 may determine a first difference $diff_1$ between the first actual value $e_1$ and the first power value $p_1$ (e.g., $diff_1=e_1-p_1$), may determine a first value $a_1$ by multiplying the first difference $diff_1$ by the attack gain coefficient $g_a$ (e.g., $a_1=g_a*diff_1$), and may subtract the first value $a_1$ from the first power value $p_1$ to determine a second actual value $e_2$, as shown below:

$$e_2=p_1+g_a(e_1-p_1) \quad [1]$$

However, the disclosure is not limited thereto, and in other examples the envelope detector 610 may determine the second actual value $e_2$ using other techniques without departing from the disclosure. For example, the envelope detector 610 may determine a second difference $diff_2$ between the first power value $p_1$ and the first actual value $e_1$ (e.g., $diff_2=p_1-e_1$), may determine a second value $a_2$ by multiplying the second difference $diff_2$ by the attack gain coefficient $g_a$ (e.g., $a_2=g_a*diff_2$), and may add the second value $a_2$ to the first actual value $e_1$ to determine a second actual value $e_2$ without departing from the disclosure, as shown below:

$$e_2=e_1+g_a(p_1-e_1) \quad [2]$$

Thus, the envelope detector 610 may determine the actual value using different techniques without departing from the disclosure. While the above examples represent the attack rate as an attack gain coefficient, the disclosure is not limited thereto and in other examples the attack rate may correspond to an attack time constant without departing from the disclosure.

When the audio data is falling (e.g., release situation), the envelope detector 610 may decrease the smoothed power signal using the instantaneous power value and the desired decay rate (e.g., decay time, decay gain coefficient, etc.). For example, if the first power value $p_1$ is less than the first actual value $e_1$, the envelope detector 610 may decrease the first actual value $e_1$ based on the first power value $p_1$ and a decay gain coefficient $g_d$. In some examples, the envelope detector 610 may determine a third difference $diff_3$ between the first actual value $e_1$ and the first power value $p_1$ (e.g., $diff_1=e_1-p_1$), may determine a third value $a_3$ by multiplying the third difference $diff_3$ by the decay gain coefficient $g_d$ (e.g., $a_3=g_d*diff_3$), and may subtract the third value $a_3$ from the first power value $p_1$ to determine the second actual value $e_2$, as shown below:

$$e_2=p_1+g_d(e_1-p_1) \quad [3]$$

However, the disclosure is not limited thereto, and in other examples the envelope detector 610 may determine the second actual value $e_2$ using other techniques without departing from the disclosure. For example, the envelope detector 610 may subtract the third value $a_3$ from the first actual value $e_1$ to determine the second actual value $e_2$ without departing from the disclosure, as shown below:

$$e_2=e_1-g_d(e_1-p_1) \quad [4]$$

Thus, the envelope detector 610 may determine the actual value using different techniques without departing from the disclosure. While the above examples represent the decay rate as a decay gain coefficient, the disclosure is not limited thereto and in other examples the decay rate may correspond to a decay time constant without departing from the disclosure. Additionally or alternatively, the decay rate may correspond to a release time constant, release gain coefficient, and/or the like.

Thus, the first envelope detector 610a may be configured to use the first portion of the audio data 525a to determine a first actual value e(0) 615a, which corresponds to an envelope of the first subband signal. For example, the first envelope detector 610a may use the attack rate and the decay rate to determine a smooth curve outlining an upper envelope of the first subband signal, such that the first actual value e(0) 615a corresponds to an instantaneous amplitude of the first subband signal at a first time.

Similarly, the final envelope detector 610K may be configured to use the final portion of the audio data 525K to determine a final actual value e(K) 615K, which corresponds to an envelope of the final subband signal. For example, the final envelope detector 610K may use the attack rate and the decay rate to determine a smooth curve outlining an upper envelope of the final subb and signal, such that the actual value e(K) 615K corresponds to an instantaneous amplitude of the final subband signal at the first time. While not illustrated in FIG. 6, the remaining envelope detectors (610b, . . . 610K−1) operate similarly to determine the actual values (615b, . . . 615K−1).

The device 110 may input the actual values 615 to an envelope estimation component 620 that is configured to generate expected values 630. For example, the envelope estimation component 620 may determine an expected value 630 for a particular subband signal by taking an average of the actual values 615 for neighboring subband signals that surround the particular subband signal. For ease of illustration, the following description refers to the envelope estimation component 620 determining an average (e.g., mean) of the actual values 615 for neighboring subband signals. However, the disclosure is not limited thereto, and the envelope estimation component 620 may determine a weighted average without departing from the disclosure.

FIG. 6 illustrates an expected value estimation chart 625 that represents a simplified example for determining the expected values 630. For ease of illustration, the expected value estimation chart 625 is incomplete and does not illustrate examples of determining the expected values 630 for all of the subband signals. Instead, the expected value estimation chart 625 only illustrates examples of determining the expected values 630 for the first fifteen subband signals (e.g., k=0 to k=14). However, the disclosure is not limited thereto and the process illustrated in the expected value estimation chart 625 may be repeated for all of the subband signals without departing from the disclosure.

While FIG. 6 illustrates a specific example of the expected value estimation chart 625, the disclosure is not limited thereto. For example, the number of neighboring subband signals may vary without departing from the disclosure. Additionally or alternatively, the envelope estimation component 620 may use other techniques to estimate the expected value a(k) without departing from the disclosure. For example, the envelope estimation component 620 may determine the expected value a(k) using any mathematical operation (e.g., linear regression, statistical analysis, etc.) that estimates the expected value a(k) for a selected subband using actual values e(k) associated with neighboring subband signals that surround the selected subband without departing from the disclosure.

As shown in the expected value estimation chart 625, the envelope estimation component 620 may determine the expected values 630 using a first number of neighboring subband signals (e.g., up to 7 subband signals in either direction, for a total of up to 14 subband signals, although the disclosure is not limited thereto). However, the disclosure is not limited thereto and the number of neighboring subband signals may vary without departing from the disclosure. For example, the envelope estimation component 620 may determine the expected values 630 using a second number of neighboring subband signals (e.g., up to 5 subband signals in either direction, for a total of up to 10 subband signals) without departing from the disclosure, although the disclosure is not limited thereto.

As illustrated in FIG. 6, a vertical axis of the expected value estimation chart 625 indicates a selected subband k for which the envelope estimation component 620 will determine an expected value a(k), while the horizontal axis indicates neighboring subbands with which the envelope estimation component 620 calculates the expected value a(k). Thus, a diamond represents the selected subband associated with the expected value a(k), while dots connected by a thick line represent the neighboring subbands used to calculate the expected value a(k). The neighboring subbands are roughly centered on the selected subband but separated into two groups, with a first group of subbands being lower than the selected subband and a second group of subbands being higher than the selected subband.

As the subbands extend from a minimum subband (e.g., k=0) to a maximum subband (e.g., k=K), the neighboring subbands used to determine the expected value a(k) may be asymmetrical for selected subbands that are in proximity to the minimum subband and/or the maximum subband. For example, the expected value estimation chart 625 illustrates an example in which the envelope estimation component 620 determines the expected value a(k) using up to 7 neighboring subbands in either direction. As a result, the expected value estimation chart 625 illustrates that the neighboring subbands used to determine the expected value a(k) are asymmetrical until the eighth subband (e.g., k=7). Thus, the expected values a(0)-a(6) for the first seven subbands (e.g., k=0 to k=6) are calculated using less than the maximum number of neighboring subbands (e.g., 13 or fewer subbands), whereas the expected values a(7)-a(14) for the next eight subbands (e.g., k=7 to k=14) are calculated using the maximum number of neighboring subbands (e.g., 14 subbands).

As illustrated in the expected value estimation chart 625, the envelope estimation component 620 may determine the first expected value a(0) by averaging a first plurality of actual values. As there are no subband signals below the first subband signal (e.g., k=0), the envelope estimation component 620 determines the first expected value a(0) by averaging the seven actual values e(1)-e(7) that are associated with subband signals higher than the first subband signal. Similarly, the envelope estimation component 620 may determine the second expected value a(1) by averaging a second plurality of actual values. In this case, there is a single subband signal below the second subband signal (e.g., k=1), so the envelope estimation component 620 determines the second expected value a(1) by averaging the first actual value e(0) and the seven actual values e(2)-e(8) that are associated with subband signals higher than the second subband signal.

As illustrated in FIG. 6, the envelope estimation component 620 may determine the third expected value a(2) by averaging nine actual values (e.g., e(0)-e(1) and e(3)-e(9)), may determine the fourth expected value a(3) by averaging ten actual values (e.g., e(0)-e(2) and e(4)-e(10)), may determine the fifth expected value a(4) by averaging eleven actual values (e.g., e(0)-e(3) and e(5)-e(11), may determine the sixth expected value a(5) by averaging twelve actual values (e.g., e(0)-e(4) and e(6)-e(12)), may determine the seventh expected value a(6) by averaging thirteen actual values (e.g., e(0)-e(5) and e(7)-e(13)), and may determine the eighth expected value a(7) by averaging fourteen actual values (e.g., e(0)-e(6) and e(8)-e(14)). From this point on, the envelope estimation component 620 may determine expected values a(k) by averaging fourteen actual values centered on the selected subband.

After determining the expected values 630 for each of the subband signals, the device 110 may determine whether feedback is detected in a selected subband signal, in which case the subband signal should be attenuated, or whether feedback is not detected in the selected subband signal, in which case the subband signal should be passed without attenuation. As illustrated in FIG. 6, the device 110 may determine (640*a*) whether a condition is satisfied for the first subband signal using the first actual value e(0) and the first expected value a(0). For example, the device 110 may determine that the condition is satisfied when the first actual value e(0) greatly exceeds the first expected value a(0), as described in greater detail below. If the device 110 determines that the condition is not satisfied, the device 110 may pass (650*a*) the first subband signal without attenuation. In contrast, if the device 110 determines that the condition is satisfied, the device 110 may attenuate (655*a*) the first subband signal.

Similarly, the device 110 may determine (640K) whether the condition is satisfied for the final subband signal using the final actual value e(K) and the final expected value a(K). For example, the device 110 may determine that the condition is satisfied when the final actual value e(K) greatly exceeds the final expected value a(K), as described in greater detail below. If the device 110 determines that the condition is not satisfied, the device 110 may pass (650K) the final subband signal without attenuation. In contrast, if the device 110 determines that the condition is satisfied, the device 110 may attenuate (655K) the final subband signal.

Figure 7:
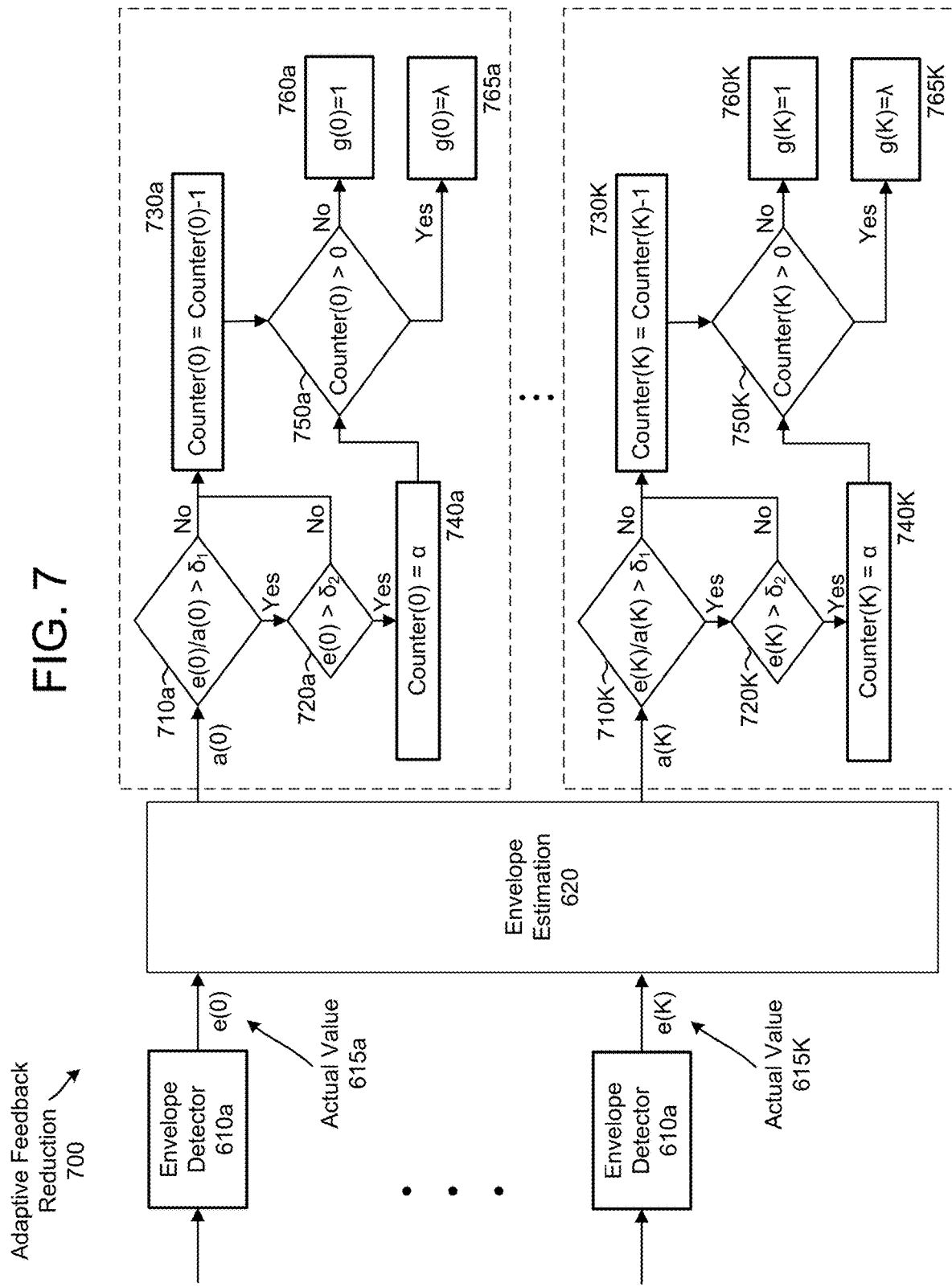
FIG. 7 illustrates an example component diagram for performing adaptive feedback reduction over time according to embodiments of the present disclosure.

FIG. 7 illustrates an example component diagram for performing adaptive feedback reduction over time according to embodiments of the present disclosure. While FIG. 7 includes some of the components illustrated in FIG. 6, FIG. 7 illustrates a more detailed example of performing adaptive feedback reduction that continues to attenuate subband signals for a period of time after detecting feedback.

As illustrated in FIG. 7, the device 110 may begin performing adaptive feedback reduction 700 as described above with regard to FIG. 6. For example, the device 110 may use envelope detectors 610 to determine actual values 615 for individual subband signals, and may use the envelope estimation component 620 to determine expected values a(k) 630 for each of the individual subband signals. While not illustrated in FIG. 7, the envelope estimation component 620 may use the expected value estimation chart 625 described above to calculate the expected values a(k).

After determining the actual values e(k) and the expected values a(k), the device 110 may determine whether to pass a selected subband signal or attenuate the selected subband signal. For example, in step 710*a* the device 110 may determine a first value bi by dividing the first actual value e(0) by the first expected value a(0) (e.g., bi=e(0)/a(0)) and may determine whether the first value bi exceeds a first threshold value $\delta_1$ (e.g., maximum envelope difference value). Thus, the first actual value e(0) satisfies a first condition when the first value bi is greater than the first threshold value $\delta_1$, which corresponds to detection of feedback. In some examples, the first threshold value $\delta_1$ may correspond to a fixed value (e.g., 6 dB), such that the first value exceeds the first threshold value $\delta_1$ when the first actual value e(0) is at least twice the first expected value e(0).

If the first value bi exceeds the first threshold value $\delta_1$, the device 110 may determine whether the first actual value e(0) exceeds a second threshold value $\delta_2$ (e.g., minimum envelope amplitude value). Thus, the first actual value e(0) satisfies a second condition when the first actual value e(0) is greater than the second threshold value $\delta_2$, which corresponds to a cutoff value below which feedback is ignored. In some examples, the second threshold value $\delta_2$ may be determined by multiplying a first coefficient value (e.g., 0.05) with an average value of the actual values e(0) for a period of time, such that the first actual value e(0) exceeds the second threshold value $\delta_2$ when the first actual value e(0) is at least $\frac{1}{20}^{th}$ of the average value. Thus, the second threshold value $\delta_2$ is selected to prevent over-attenuation (e.g., attenuating for too long) when the first actual value e(0) is decreasing over time.

If the first value bi does not exceed the first threshold value $\delta_1$ and/or if the first actual value e(0) does not exceed the second threshold value $\delta_2$, the device 110 may decrement (730*a*) a first counter value associated with the first subband signal (e.g., Counter(0)=Counter(0)−1). If, however, the first value exceeds the first threshold value $\delta_1$ and the first actual value e(0) exceeds the second threshold value $\delta_2$, the device 110 may set (740*a*) the first counter value to a fixed value (e.g., Counter(0)=α, where α is a parameter controlling how long the device 110 attenuates the subband signal).

Whether the device 110 decrements the first counter value in step 730*a* or sets the first counter value to the fixed value in step 740*a*, the device 110 may determine (750*a*) whether the first counter value is greater than zero (e.g., Counter(0) >0). If the first counter value is equal to zero, the device 110 may pass (760*a*) the first subband signal without attenuation by setting a first gain value equal to a value of one (e.g., g(0)=1). However, if the first counter value is greater than zero, the device 110 may attenuate (765*a*) the first subband signal by setting the first gain value equal to an attenuation parameter λ (e.g., g(0)=λ).

Similarly, in step 710K the device 110 may determine a final value (e.g., e(K)/a(K)) by dividing the final actual value e(K) by the final expected value a(K) and may determine whether the final value exceeds the first threshold value $\delta_1$ (e.g., maximum envelope difference value). If the final value exceeds the first threshold value $\delta_1$, the device 110 may determine whether the final actual value e(K) exceeds the second threshold value $\delta_2$ (e.g., minimum envelope amplitude value).

If the final value does not exceed the first threshold value $\delta_1$ and/or if the final actual value e(0) does not exceed the second threshold value $\delta_2$, the device 110 may decrement (730K) a final counter value associated with the final subband signal (e.g., Counter(K)=Counter(K)−1). If, however, the final value exceeds the first threshold value $\delta_1$ and the final actual value e(K) exceeds the second threshold value $\delta_2$, the device 110 may set (740K) the final counter value to the fixed value (e.g., Counter(K)=α).

Whether the device 110 decrements the final counter value in step 730K or sets the final counter value to the fixed value in step 740K, the device 110 may determine (750K) whether the final counter value is greater than zero (e.g., Counter(K)>0). If the final counter value is equal to zero, the device 110 may pass (760K) the final subband signal without attenuation by setting a final gain value equal to a value of one (e.g., g(K)=1). However, if the final counter value is greater than zero, the device 110 may attenuate (765K) the final subband signal by setting the final gain value equal to the attenuation parameter λ (e.g., g(K)=λ).

As illustrated in FIG. 7, during adaptive feedback reduction 700 the device 110 may attenuate a selected subband signal for a period of time based on the fixed value α. For example, whenever the device 110 determines that feedback is present in the selected subband signal, the device 110 sets a corresponding counter value equal to the fixed value α, which causes the device 110 to attenuate the selected subband signal. However, when the device 110 determines that feedback is not present in the selected subband signal, the device 110 decrements this counter value. Thus, the device 110 attenuates the selected subband signal for a period of time equal to the fixed value α, as the device 110 has to determine that feedback is not present in the selected subband signal for α audio samples before the counter value decrements to zero.

Figure 8:
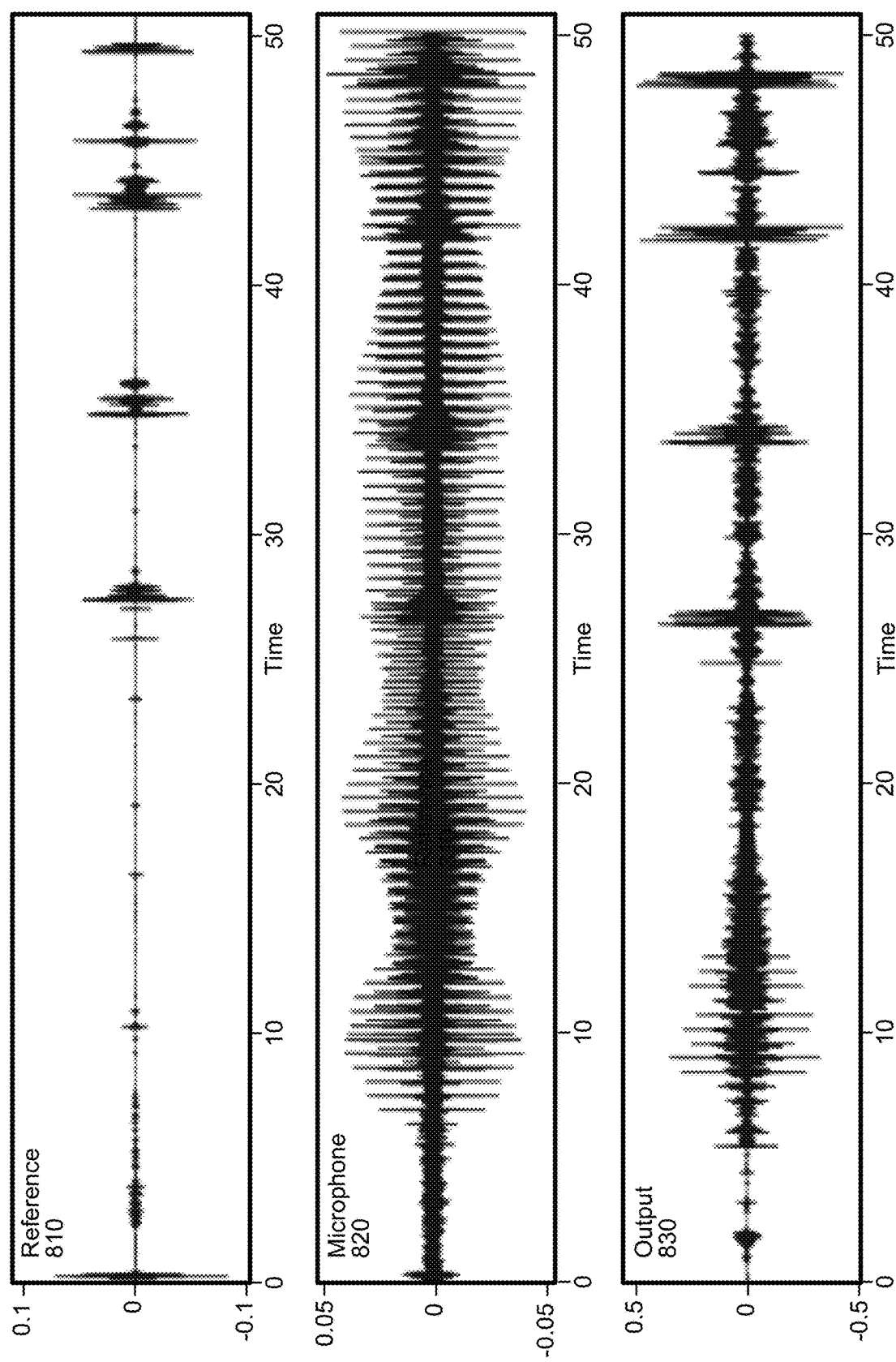
FIG. 8 illustrates an example of a reference signal, an input signal, and an output signal according to embodiments of the present disclosure.

FIG. 8 illustrates an example of a reference signal, an input signal, and an output signal according to embodiments of the present disclosure. As described above with regard to FIG. 1, a first device 110a may receive a reference signal 810 from a second device 110b during a communication session and the first device 110a may use the reference signal 810 to generate output audio. While generating the output audio, the first device 110a may generate a microphone signal 820. As illustrated in FIG. 8, feedback (e.g., howling) is present in the microphone signal 820, indicating that the first device 110a and the second device 110b are acoustically coupled. This feedback would cause an unpleasant user experience if sent to the second device 110b during the communication session.

To suppress the feedback (e.g., perform howling suppression), the device 110 may process the microphone signal 820 using the AFR component 530 to generate an output signal 830. For example, the device 110 may perform adaptive feedback reduction processing as described above with regard to FIGS. 6-7 to generate the output signal 830.

Figure 9:
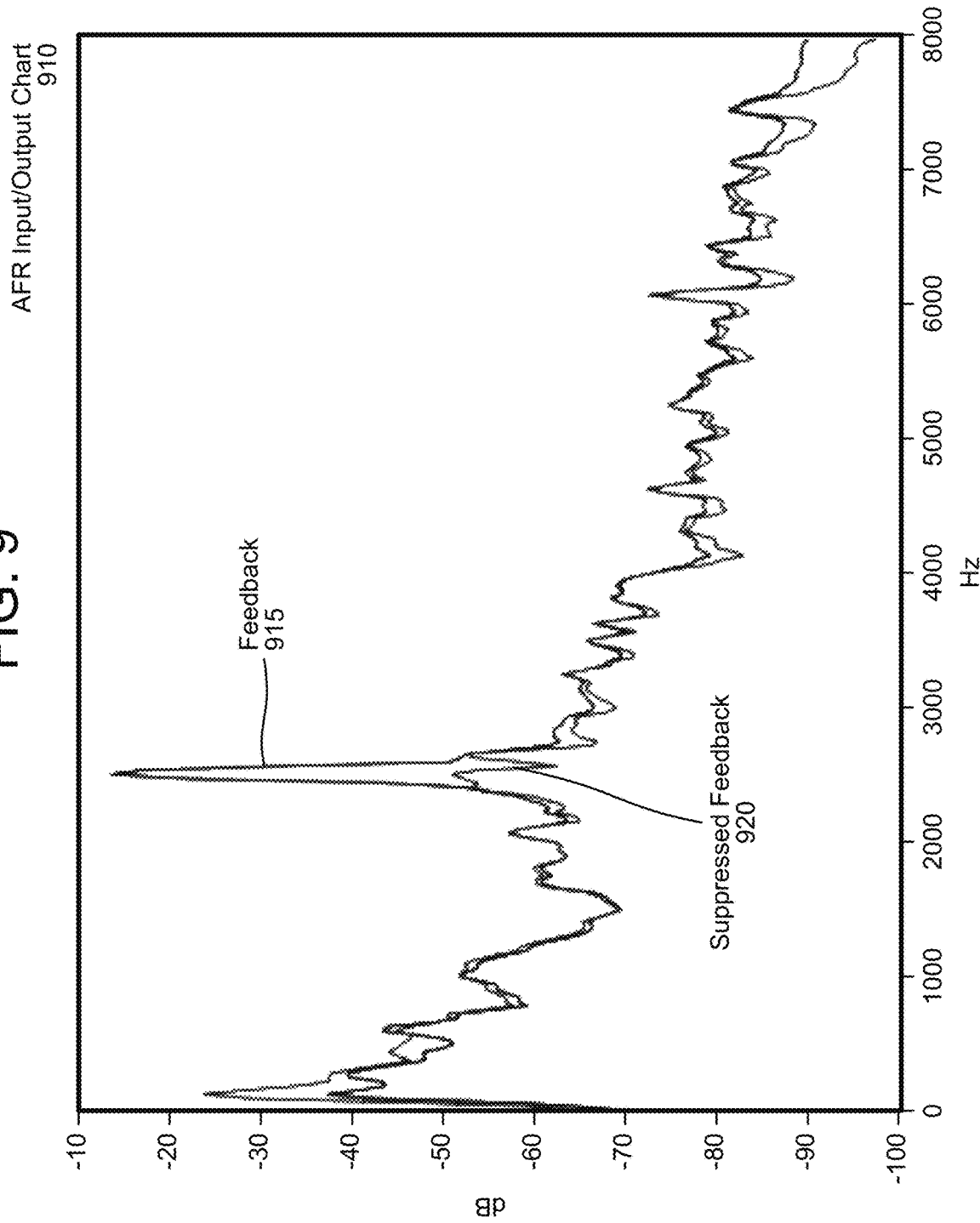
FIG. 9 illustrates an example of an unsuppressed feedback signal and a suppressed feedback signal according to embodiments of the present disclosure.

FIG. 9 illustrates an example of an unsuppressed feedback signal and a suppressed feedback signal according to embodiments of the present disclosure. As illustrated in FIG. 9, AFR Input/Output Chart 910 illustrates an example of an input to the AFR component 530 (e.g., microphone signal 820) that exhibits feedback 915 (e.g., howling) within certain subbands (e.g., peak is present around 2500 Hz). By performing adaptive feedback reduction processing using the AFR component 530, the device 110 may generate an output (e.g., output signal 830) that exhibits suppressed feedback 920 within these subbands. Thus, the AFR component 530 suppresses the howling.

Figure 10A:
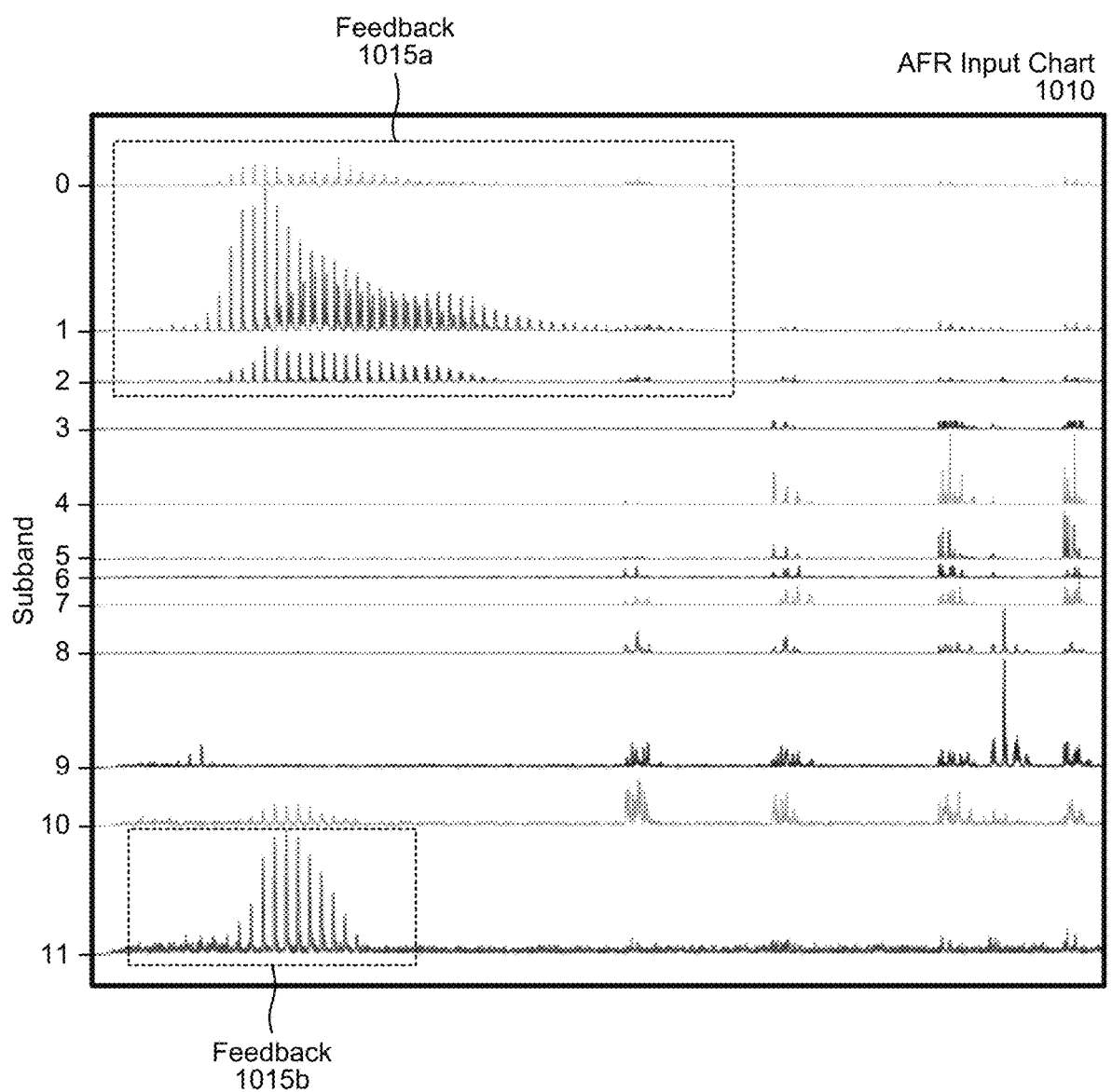
FIGS. 10A-10B illustrate examples of input signals and output signals associated with multiple frequency ranges according to embodiments of the present disclosure.
Figure 10B:
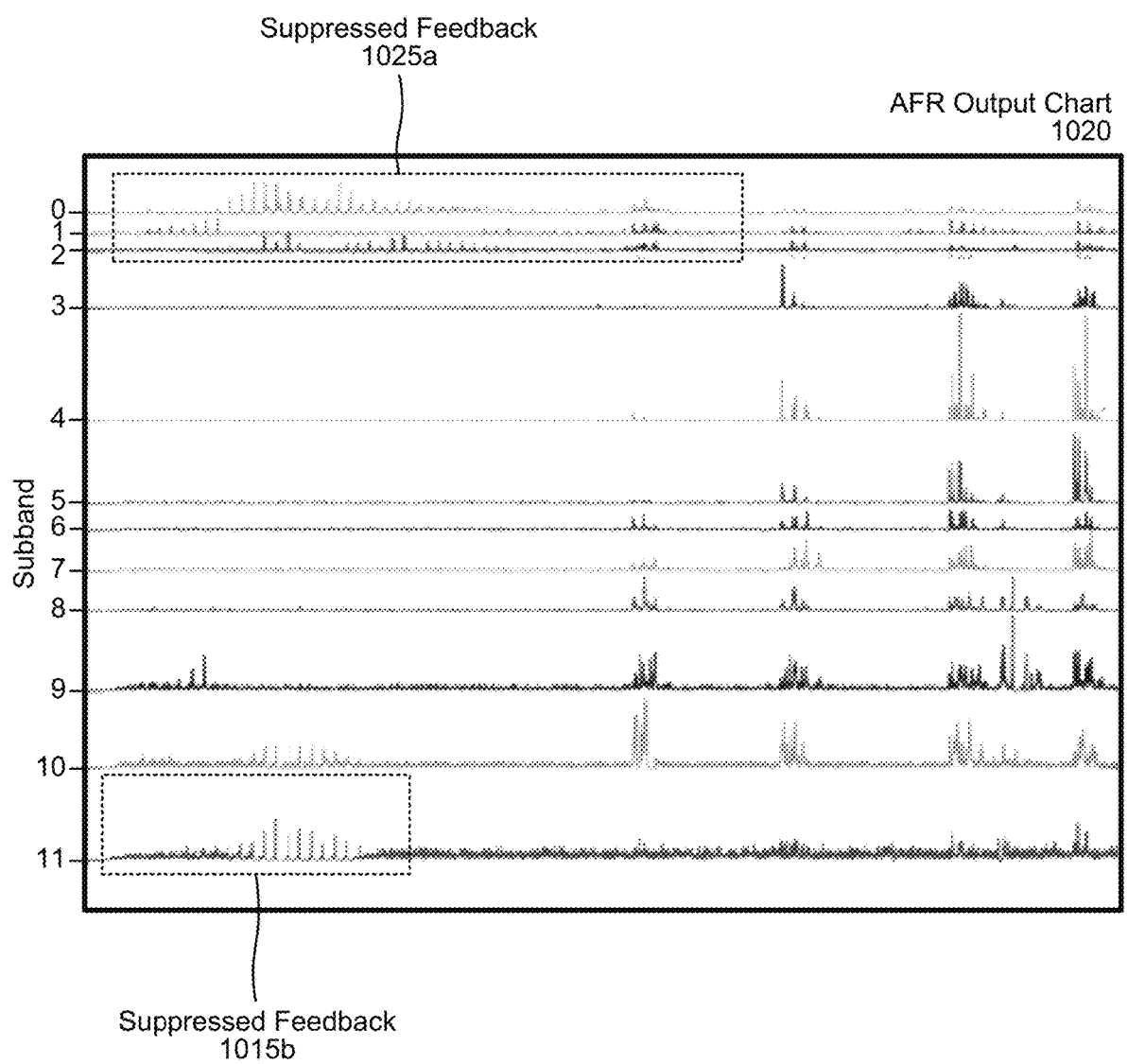

FIGS. 10A-10B illustrate examples of input signals and output signals associated with multiple frequency ranges according to embodiments of the present disclosure. As illustrated in FIG. 10A, AFR input chart 1010 illustrates example waveforms for a plurality of subband signals. For ease of illustration, the AFR input chart 1010 only includes twelve subband signals (e.g., from k=0 to k=11), but the disclosure is not limited thereto.

As illustrated in the AFR input chart 1010, some of the subband signals are considerably larger than would be expected based on neighboring subband signals. For example, the first three subband signals (e.g., k=0-2) exhibit first feedback 1015a, while a twelfth subband signal (e.g., k=11) exhibits second feedback 1015b.

By comparing the actual values e(k) to the expected values a(k), the device 110 may identify the subband signals that represent feedback (e.g., howling) and may perform attenuation to suppress the feedback. For example, FIG. 10B illustrates an AFR output chart 1020 that includes example waveforms for the plurality of subband signals that are output by the AFR component 530. As illustrated in FIG. 10B, the AFR component 530 may attenuate the feedback represented in the first three subband signals (e.g., k=0-2), illustrated as first suppressed feedback 1025a. In addition, the AFR component 530 may attenuate the feedback represented in the twelfth subband signal (e.g., k=11), illustrated as second suppressed feedback 1025b.

FIG. 11 is a flowchart conceptually illustrating an example method for generating output audio according to embodiments of the present disclosure. As illustrated in FIG. 11, the device 110 may receive (130) first audio data from a microphone and may generate (132) second audio data in a subband-domain. For example, the device 110 may generate the second audio data using the filter bank 520, as described in greater detail above with regard to FIG. 5.

The device 110 may perform (1110) adaptive feedback reduction to generate third audio data. For example, the device 110 may perform adaptive feedback reduction 600/700 using the AFR component 530 described in greater detail above with regard to FIGS. 5-7, although the disclosure is not limited thereto.

The device 110 may perform (1112) acoustic echo cancellation on the third audio data to generate fourth audio data. For example, the device 110 may perform echo cancellation using the AEC component 540 described in greater detail above with regard to FIG. 5. In addition, the device 110 may perform (1114) noise reduction on the fourth audio data to generate output audio data and may send (146) the output audio data to a remote device (e.g., second device 110b, although the disclosure is not limited thereto). For example, the device 110 may perform noise reduction processing using the NR component 550 described in greater detail above with regard to FIG. 5.

Figure 12:
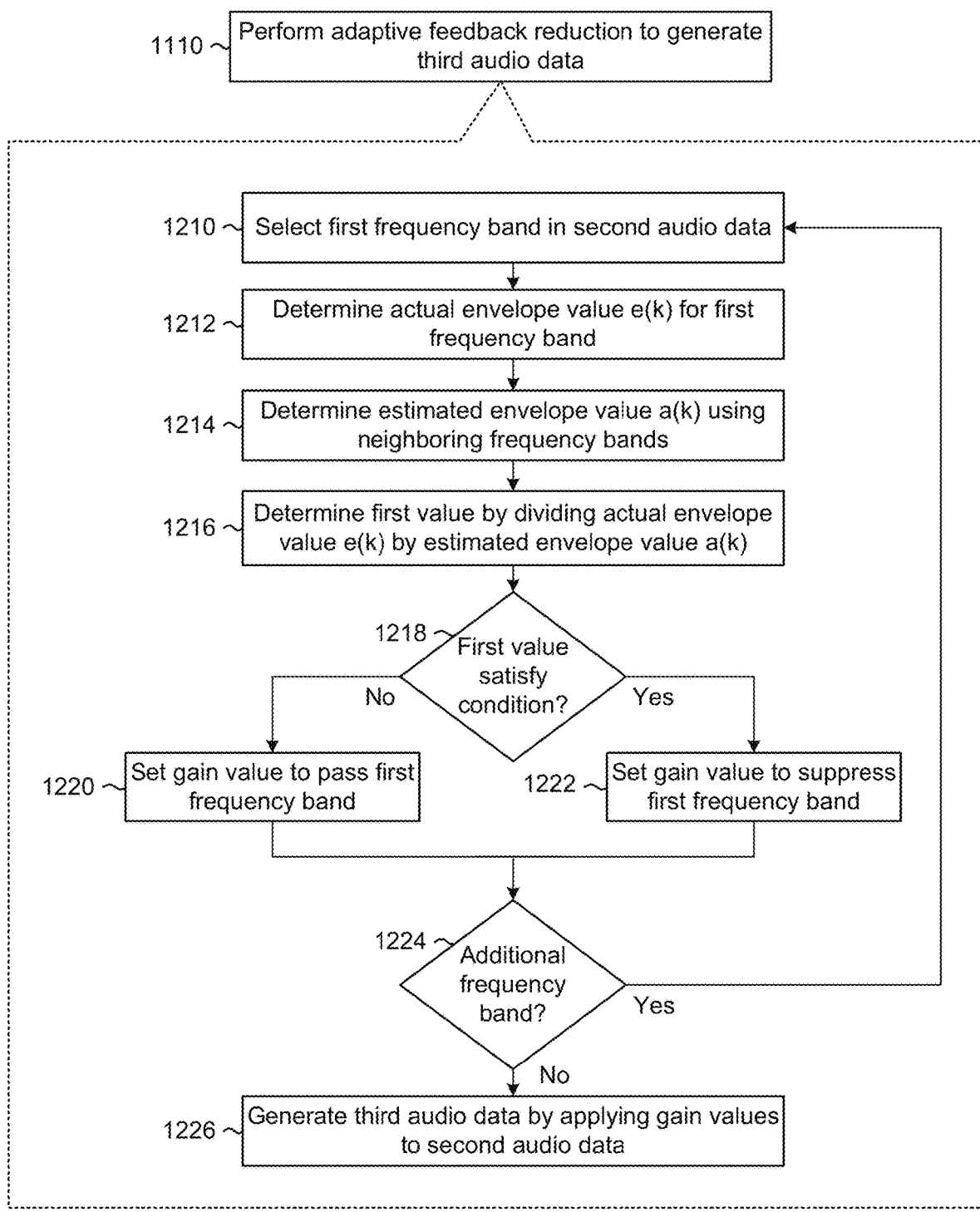
FIG. 12 is a flowchart conceptually illustrating a first example method for performing adaptive feedback reduction according to embodiments of the present disclosure.

FIG. 12 is a flowchart conceptually illustrating a first example method for performing adaptive feedback reduction according to embodiments of the present disclosure. As illustrated in FIG. 12, the device 110 may select (1210) a first frequency band in the second audio data, may determine (1212) an actual envelope value e(k) for the first frequency band, and may determine (1214) an estimated envelope value a(k) using neighboring frequency bands, as described in greater detail above with regard to FIG. 6. For example, the device 110 may determine the actual envelope value e(k) for each of the frequency bands (e.g., subband signals) using envelope detectors 610. Based on the actual envelope values e(k), the device 110 may then determine the estimated envelope value a(k) for the first frequency band by taking an average of actual envelope values a(k) associated with neighboring frequency bands surrounding the first frequency band. For example, the device 110 may determine the estimated envelope value a(k) for the first frequency band by taking an average of first actual envelope values associated with seven frequency bands below the first frequency band (e.g., actual envelope values e(k−7) to e(k−1)) and second actual envelope values associated with seven frequency bands above the first frequency band (e.g., actual envelope values e(k+1) to e(k+7)), although the disclosure is not limited thereto.

To determine whether feedback is represented in the first frequency band, the device 110 may determine (1216) a first value by dividing the actual envelope value e(k) by the estimated envelope value a(k), as described in greater detail above with regard to FIG. 7, and may determine (1218)

whether the first value satisfies a condition. For example, the first value may satisfy the condition if the first value exceeds a first threshold value. If the first value does not satisfy the condition (e.g., the first value is below the first threshold value $\delta_1$), the device 110 may set (1220) a first gain value associated with the first frequency band to a value of one in order to pass the first frequency band. In contrast, if the first value satisfies the condition (e.g., the first value is above the first threshold value $\delta_1$), the device 110 may set (1222) the first gain value associated with the first frequency band to an attenuation value (e.g., $\lambda$) in order to attenuate the first frequency band.

As used herein, the attenuation value $\lambda$ may be greater than zero and less than one, such that applying the attenuation value $\lambda$ suppresses the feedback present in the first frequency band. Additionally or alternatively, while step 1220 describes an example of setting the first gain value equal to a value of one in order to pass the first frequency band, the disclosure is not limited thereto and in some examples the device 110 may set the first gain value to value less than one without departing from the disclosure.

The device 110 may determine (1224) whether there is an additional frequency band, and if so, may loop to step 1210 and repeat steps 1210-1222 for the additional frequency band. If there are no additional frequency bands, the device 110 may generate (1226) third audio data by applying the gain values to the second audio data. For example, setting the first gain value in steps 1220/1222 may set a portion of gain data for a selected frequency band and the device 110 may generate the third audio data by applying the gain data to the second audio data, although the disclosure is not limited thereto.

Figure 13:
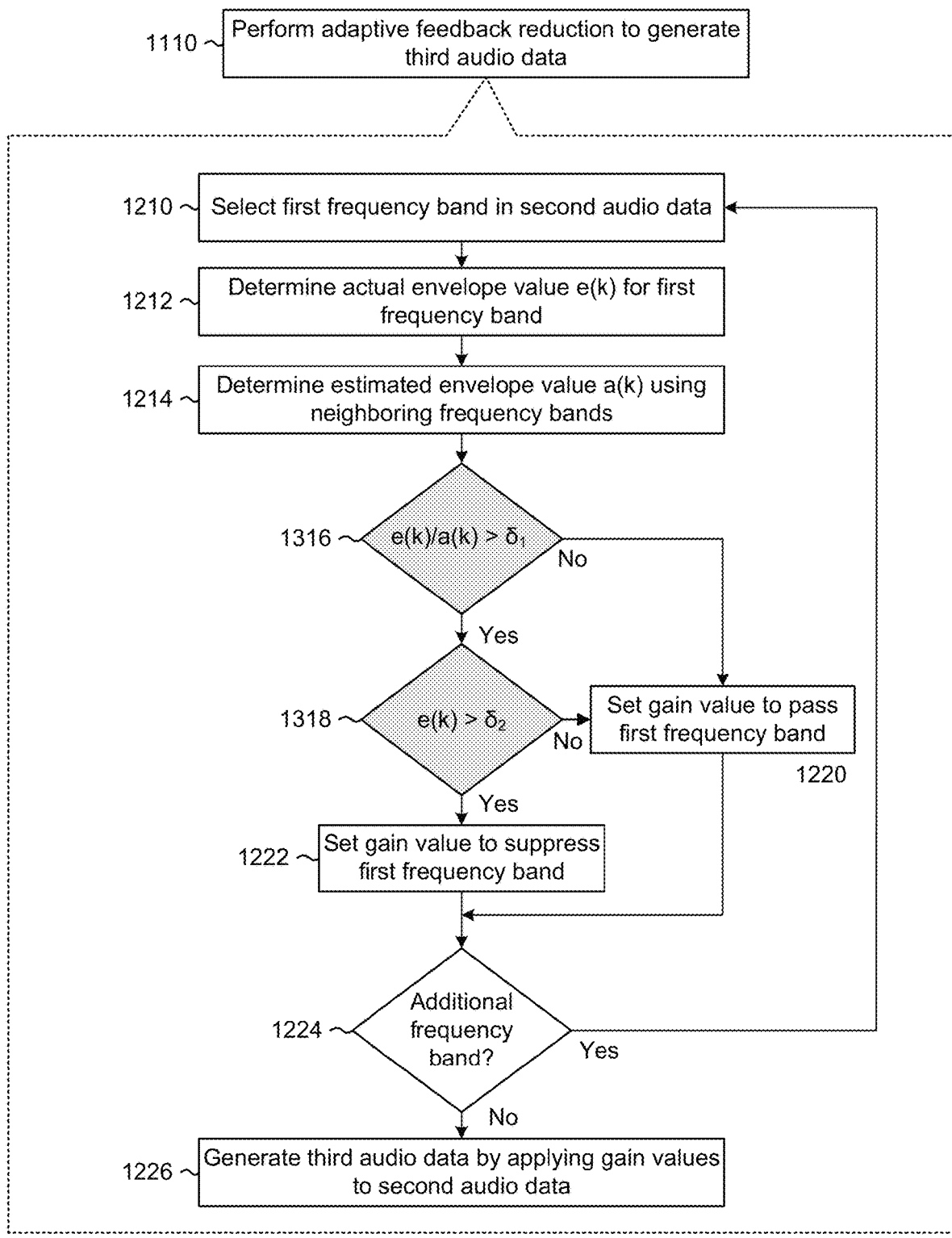
FIG. 13 is a flowchart conceptually illustrating a second example method for performing adaptive feedback reduction according to embodiments of the present disclosure.

FIG. 13 is a flowchart conceptually illustrating a second example method for performing adaptive feedback reduction according to embodiments of the present disclosure. As several of the steps illustrated in FIG. 13 are described above with regard to FIG. 12, a redundant description is omitted. For example, the device 110 may select (1210) a first frequency band in the second audio data, determine (1212) an actual envelope value e(k) for the first frequency band, and may determine (1214) an estimated envelope value a(k) using neighboring frequency bands, as described above with regard to FIG. 12.

As illustrated in FIG. 12, the device 110 may determine (1316) whether the actual envelope value e(k) divided by the expected envelope value a(k) is greater than the first threshold value $\delta_1$ (e.g., the first value is above the first threshold value $\delta_1$) and may determine (1318) whether the actual envelope value e(k) is greater than a second threshold value $\delta_2$. If either of these threshold values are not met, the device 110 may set (1220) the first gain value associated with the first frequency band to a value of one in order to pass the first frequency band. In contrast, if both of these threshold values are met, the device 110 may set (1222) the first gain value associated with the first frequency band to an attenuation value (e.g., $\lambda$) in order to attenuate the first frequency band.

The device 110 may determine (1224) whether there is an additional frequency band, and if so, may loop to step 1210 and repeat the steps described above for the additional frequency band. If there are no additional frequency bands, the device 110 may generate (1226) third audio data by applying the gain values to the second audio data. For example, setting the first gain value in steps 1220/1222 may set a portion of gain data for a selected frequency band and the device 110 may generate the third audio data by applying the gain data to the second audio data, although the disclosure is not limited thereto.

Figure 14:
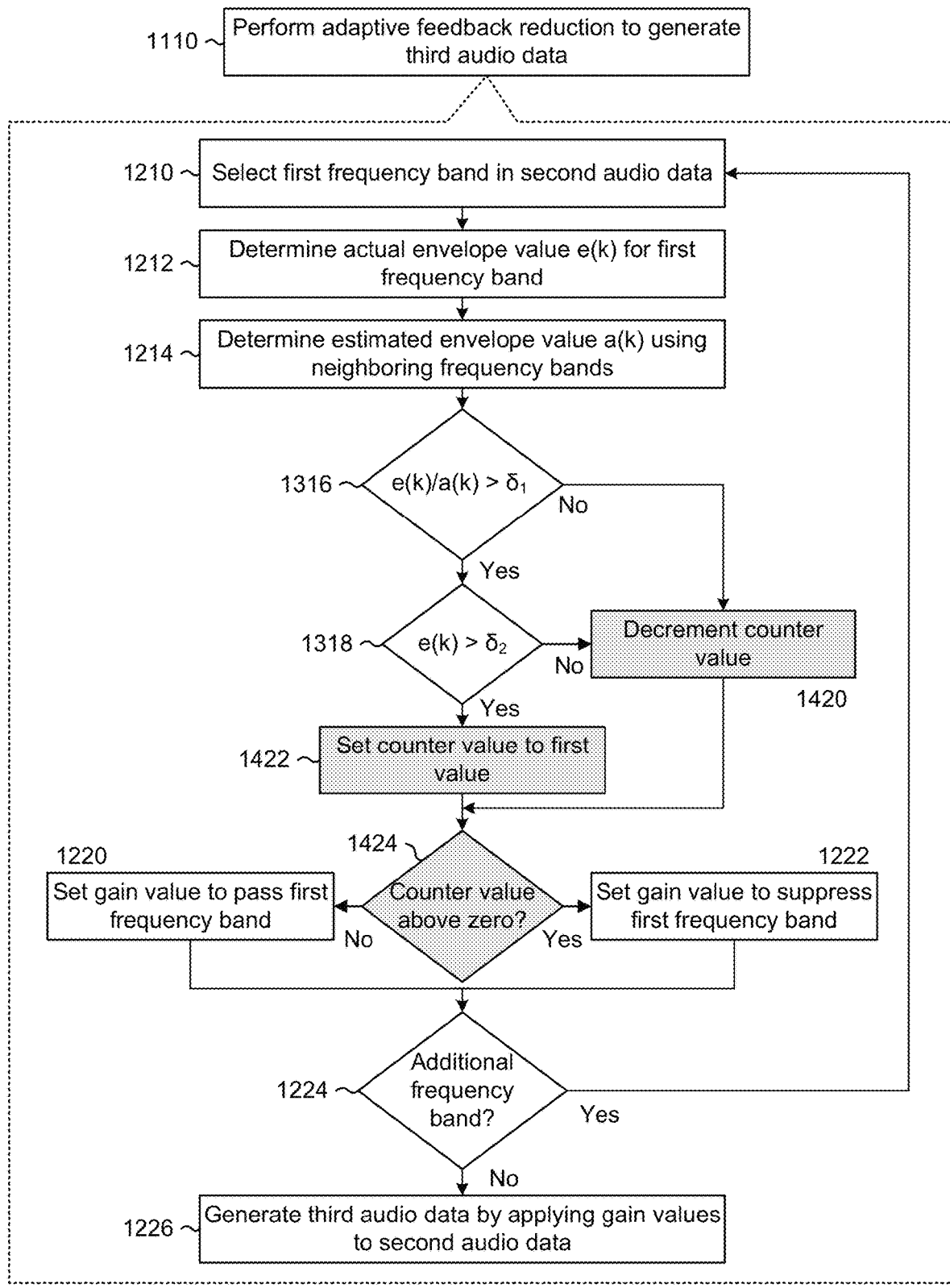
FIG. 14 is a flowchart conceptually illustrating a third example method for performing adaptive feedback reduction according to embodiments of the present disclosure.

FIG. 14 is a flowchart conceptually illustrating a third example method for performing adaptive feedback reduction according to embodiments of the present disclosure. As several of the steps illustrated in FIG. 14 are described above with regard to FIGS. 12-13, a redundant description is omitted.

As illustrated in FIG. 12, the device 110 may determine (1316) whether the actual envelope value e(k) divided by the expected envelope value a(k) is greater than the first threshold value $\delta_1$ (e.g., the first value is above the first threshold value $\delta_1$) and may determine (1318) whether the actual envelope value e(k) is greater than a second threshold value $\delta_2$. If either of these threshold values are not met, the device 110 may decrement (1420) a first counter value associated with the first frequency band. In contrast, if both of these threshold values are met, the device 110 may set (1422) the first counter value to a first value in order to attenuate the first frequency band for a period of time. For example, the device 110 may determine (1424) whether the first counter value is above zero and, if not, may set (1220) the first gain value associated with the first frequency band to a value of one in order to pass the first frequency band. If, however, the first counter value is above zero, the device 110 may set (1222) the first gain value associated with the first frequency band to an attenuation value (e.g., $\lambda$) in order to attenuate the first frequency band.

The device 110 may determine (1224) whether there is an additional frequency band, and if so, may loop to step 1210 and repeat the steps described above for the additional frequency band. If there are no additional frequency bands, the device 110 may generate (1226) third audio data by applying the gain values to the second audio data. For example, setting the first gain value in steps 1220/1222 may set a portion of gain data for a selected frequency band and the device 110 may generate the third audio data by applying the gain data to the second audio data, although the disclosure is not limited thereto.

Figure 15:
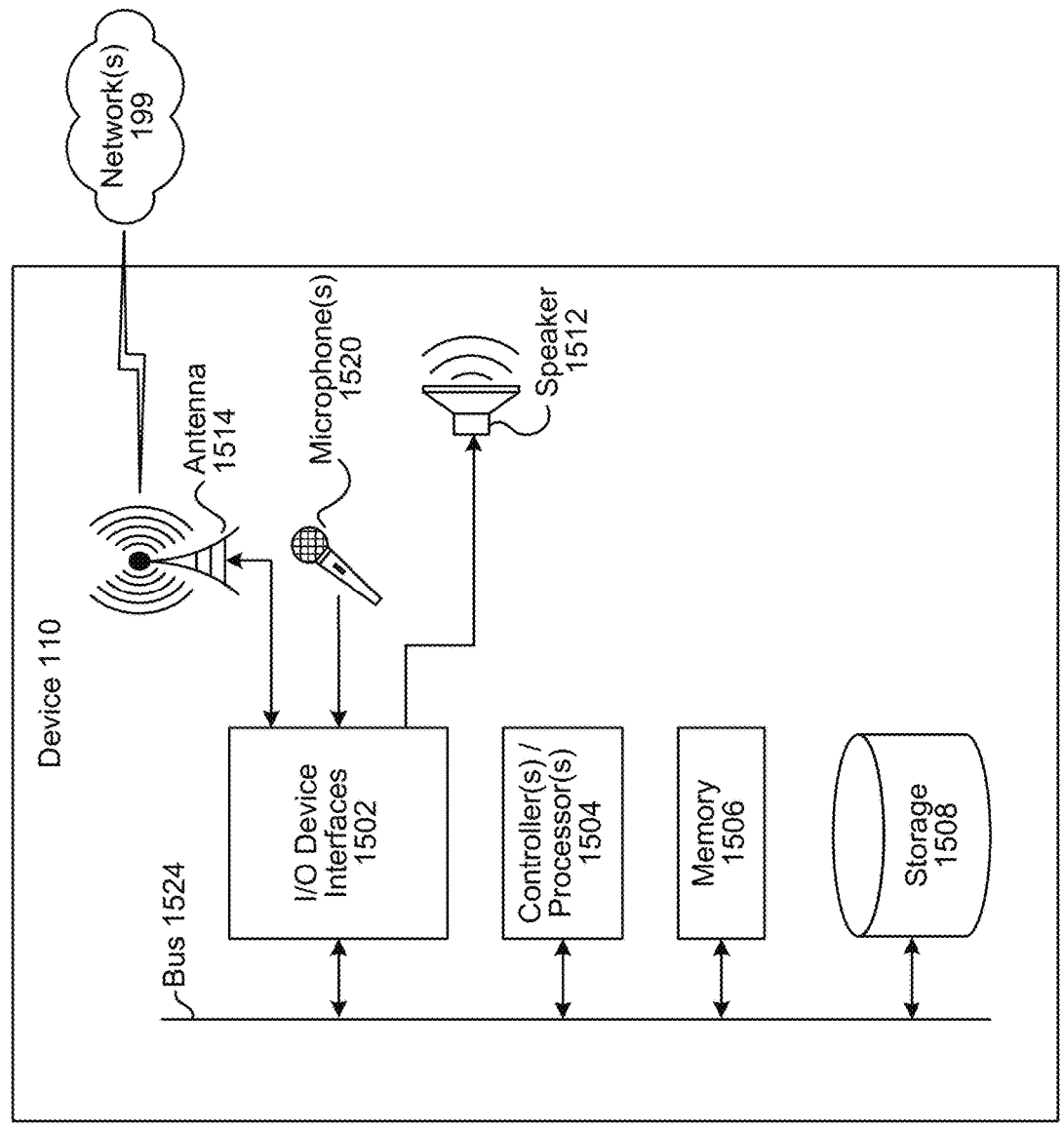
FIG. 15 is a block diagram conceptually illustrating example components of a device, according to embodiments of the present disclosure.
Figure 16:
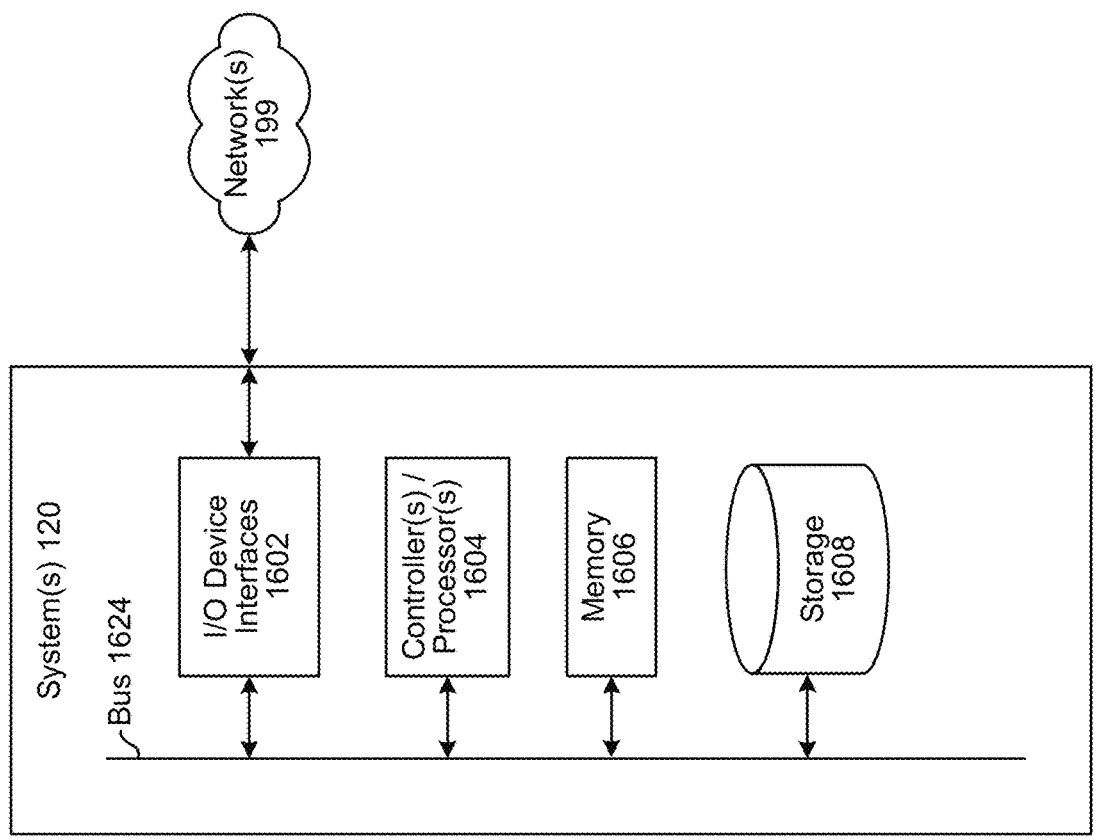
FIG. 16 is a block diagram conceptually illustrating example components of a system, according to embodiments of the present disclosure.

FIG. 15 is a block diagram conceptually illustrating a device 110. FIG. 16 is a block diagram conceptually illustrating example components of a remote device, such as the media transport system 120. In operation, the system 100 may include computer-readable and computer-executable instructions that reside on the device 110 and/or the media transport system 120, as will be discussed further below. In addition, multiple devices 110 and/or multiple media transport systems 120 may be included in the system 100 of the present disclosure without departing from the disclosure.

The media transport system 120 may include one or more servers. A "server" as used herein may refer to a traditional server as understood in a server/client computing structure but may also refer to a number of different computing components that may assist with the operations discussed herein. For example, a server may include one or more physical computing components (such as a rack server) that are connected to other devices/components either physically and/or over a network and is capable of performing computing operations. A server may also include one or more virtual machines that emulates a computer system and is run on one or across multiple devices. A server may also include other combinations of hardware, software, firmware, or the like to perform operations discussed herein. The media transport system 120 may be configured to operate using one or more of a client-server model, a computer bureau model, grid computing techniques, fog computing techniques, mainframe techniques, utility computing techniques, a peer-to-peer model, sandbox techniques, or other computing techniques.

Each of these devices (110/120) may include one or more controllers/processors (1504/1604), which may each include a central processing unit (CPU) for processing data and computer-readable instructions, and a memory (1506/1606) for storing data and instructions of the respective device. The memories (1506/1606) may individually include volatile random access memory (RAM), non-volatile read only memory (ROM), non-volatile magnetoresistive memory (MRAM), and/or other types of memory. Each device (110/120) may also include a data storage component (1508/1608) for storing data and controller/processor-executable instructions. Each data storage component (1508/1608) may individually include one or more non-volatile storage types such as magnetic storage, optical storage, solid-state storage, etc. Each device (110/120) may also be connected to removable or external non-volatile memory and/or storage (such as a removable memory card, memory key drive, networked storage, etc.) through respective input/output device interfaces (1502/1602).

Each device (110/120) may include components that may comprise processor-executable instructions stored in storage (1508/1608) to be executed by controller(s)/processor(s) (1504/1604) (e.g., software, firmware, hardware, or some combination thereof). For example, components of the device (110/120) may be part of a software application running in the foreground and/or background on the device (110/120). Some or all of the controllers/components of the device (110/120) may be executable instructions that may be embedded in hardware or firmware in addition to, or instead of, software. In one embodiment, the device (110/120) may operate using an Android operating system (such as Android 4.3 Jelly Bean, Android 4.4 KitKat or the like), an Amazon operating system (such as FireOS or the like), or any other suitable operating system.

Computer instructions for operating each device (110/120) and its various components may be executed by the respective device's controller(s)/processor(s) (1504/1604), using the memory (1506/1606) as temporary "working" storage at runtime. A device's computer instructions may be stored in a non-transitory manner in non-volatile memory (1506/1606), storage (1508/1608), or an external device(s). Alternatively, some or all of the executable instructions may be embedded in hardware or firmware on the respective device in addition to or instead of software.

Each device (110/120) includes input/output device interfaces (1502/1602). A variety of components may be connected through the input/output device interfaces (1502/1602), as will be discussed further below. Additionally, each device (110/120) may include an address/data bus (1524/1624) for conveying data among components of the respective device. Each component within a device (110/120) may also be directly connected to other components in addition to (or instead of) being connected to other components across the bus (1524/1624).

Referring to FIG. 15, the device 110 may include input/output device interfaces 1502 that connect to a variety of components such as an audio output component such as a speaker 1512, a wired headset or a wireless headset (not illustrated), or other component capable of outputting audio (e.g., producing sound). The audio output component may be integrated into a single device or may be separate. The device 110 may also include one or more audio capture component(s). For example, the device 110 may include one or more microphone(s) (e.g., a plurality of microphone(s) in a microphone array), a wired headset or a wireless headset (not illustrated), and/or the like. The audio capture component(s) may be integrated into a single device or may be separate. If an array of microphones is included, approximate distance to a sound's point of origin may be determined by acoustic localization based on time and amplitude differences between sounds captured by different microphones of the array. The device 110 may additionally include a display (not illustrated) for displaying content and/or may further include a camera (not illustrated), although the disclosure is not limited thereto. In some examples, the microphone(s) 1520 and/or loudspeaker(s) 1512 may be external to the device 110, although the disclosure is not limited thereto. The input/output interfaces 1502 may include A/D converters (not illustrated) and/or D/A converters (not illustrated) without departing from the disclosure.

The input/output device interfaces 1502 may also include an interface for an external peripheral device connection such as universal serial bus (USB), FireWire, Thunderbolt, Ethernet port or other connection protocol that may connect to network(s) 199.

The input/output device interfaces 1502/1602 may be configured to operate with network(s) 199. For example, via antenna(s) 1514, the input/output device interfaces 1502 may connect to one or more networks 199 via a wireless local area network (WLAN) (such as Wi-Fi) radio, Bluetooth, and/or wireless network radio, such as a radio capable of communication with a wireless communication network such as a Long Term Evolution (LTE) network, WiMAX network, 3G network, 4G network, 5G network, etc. A wired connection such as Ethernet may also be supported. Thus, the devices (110/120) may be connected to the network(s) 199 through either wired or wireless connections.

The network(s) 199 may include a local or private network or may include a wide network (e.g., wide area network (WAN)), such as the internet. Through the network(s) 199, the system may be distributed across a networked environment. The I/O device interface (1502/1602) may also include communication components that allow data to be exchanged between devices such as different physical servers in a collection of servers or other components.

The components of the device 110 and/or the media transport system 120 may include their own dedicated processors, memory, and/or storage. Alternatively, one or more of the components of the device 110 and/or the media transport system 120 may utilize the I/O interfaces (1502/1602), processor(s) (1504/1604), memory (1506/1606), and/or storage (1508/1608) of the device(s) 110 and/or the media transport system 120.

As noted above, multiple devices may be employed in a single system. In such a multi-device system, each of the devices may include different components for performing different aspects of the system's processing. The multiple devices may include overlapping components. The components of the device 110 and the system 120 as described herein, are illustrative, and may be located as a stand-alone device or may be included, in whole or in part, as a component of a larger device or system.

Figure 17:
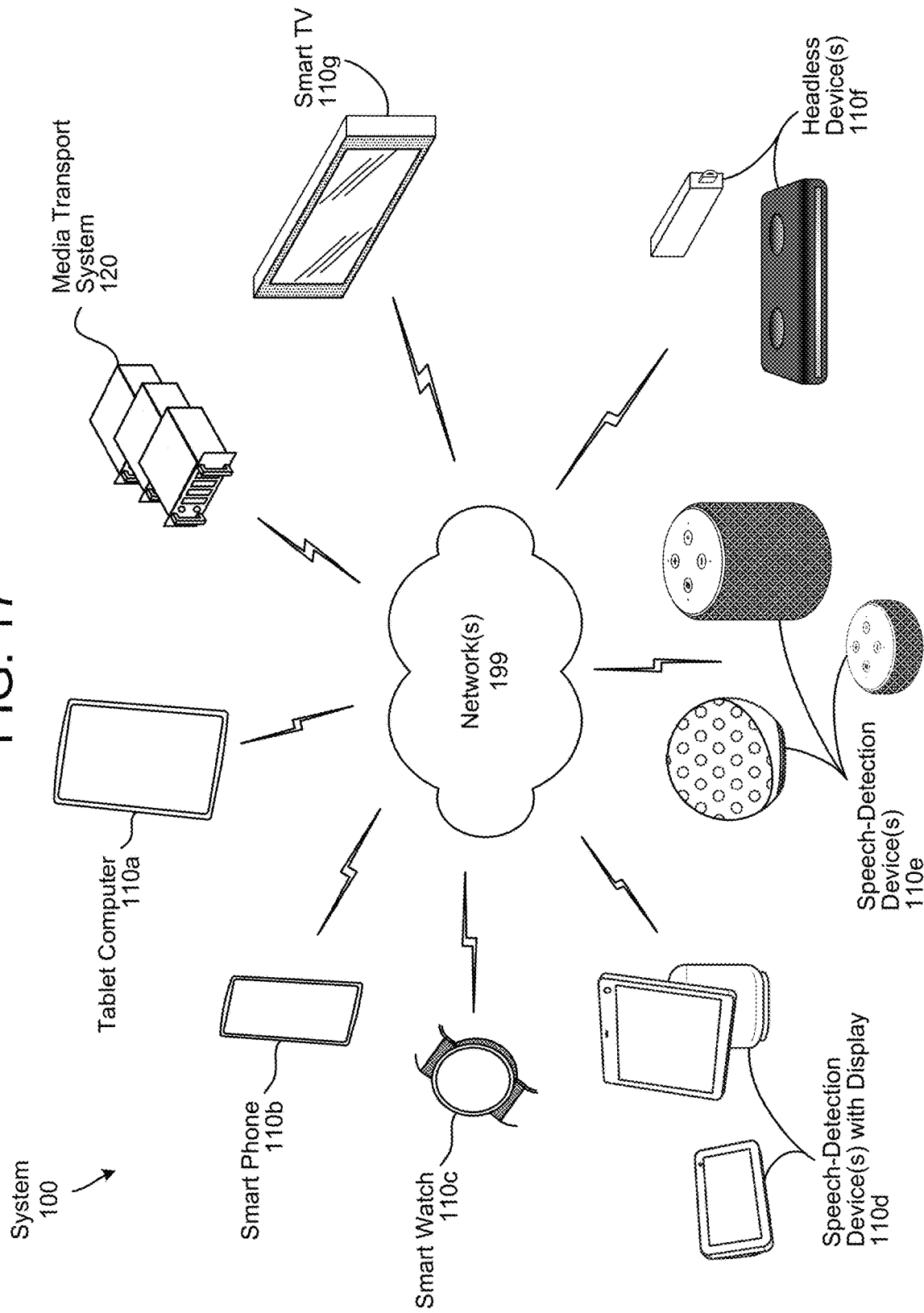
FIG. 17 illustrates an example of a computer network for use with the overall system, according to embodiments of the present disclosure.

As illustrated in FIG. 17, multiple devices (110a-110g and 120) may contain components of the system and the devices may be connected over a network(s) 199. The network(s) 199 may include a local or private network or may include a wide network such as the Internet. Devices may be connected to the network(s) 199 through either wired or wireless connections. For example, a tablet computer 110a, a smart phone 110b, a smart watch 110c, speech-detection device(s) with a display 110d, speech-detection device(s) 110e, headless device(s) 110h, and/or a smart television 110g may be connected to the network(s) 199 through a wired and/or wireless connection. For example, the devices 110 may be connected to the network(s) 199 via an Ethernet port, a wireless service provider, over a Wi-Fi or cellular network connection, and/or the like.

The concepts disclosed herein may be applied within a number of different devices and computer systems, including, for example, general-purpose computing systems, speech processing systems, server-client computing systems, mainframe computing systems, telephone computing systems, laptop computers, cellular phones, personal digital assistants (PDAs), tablet computers, video capturing devices, wearable computing devices (watches, glasses, etc.), other mobile devices, video game consoles, speech processing systems, distributed computing environments, etc. Thus the components, components and/or processes described above may be combined or rearranged without departing from the present disclosure. The functionality of any component described above may be allocated among multiple components, or combined with a different component. As discussed above, any or all of the components may be embodied in one or more general-purpose microprocessors, or in one or more special-purpose digital signal processors or other dedicated microprocessing hardware. One or more components may also be embodied in software implemented by a processing unit. Further, one or more of the components may be omitted from the processes entirely.

The above aspects of the present disclosure are meant to be illustrative. They were chosen to explain the principles and application of the disclosure and are not intended to be exhaustive or to limit the disclosure. Many modifications and variations of the disclosed aspects may be apparent to those of skill in the art. Persons having ordinary skill in the field of computers and speech processing should recognize that components and process steps described herein may be interchangeable with other components or steps, or combinations of components or steps, and still achieve the benefits and advantages of the present disclosure. Moreover, it should be apparent to one skilled in the art, that the disclosure may be practiced without some or all of the specific details and steps disclosed herein.

Aspects of the disclosed system may be implemented as a computer method or as an article of manufacture such as a memory device or non-transitory computer readable storage medium. The computer readable storage medium may be readable by a computer and may comprise instructions for causing a computer or other device to perform processes described in the present disclosure. The computer readable storage medium may be implemented by a volatile computer memory, non-volatile computer memory, hard drive, solid-state memory, flash drive, removable disk, and/or other media.

Embodiments of the present disclosure may be performed in different forms of software, firmware, and/or hardware. For example, an acoustic front end (AFE), may comprise, among other things, analog and/or digital filters (e.g., filters configured as firmware to a digital signal processor (DSP)). Further, the teachings of the disclosure may be performed by an application specific integrated circuit (ASIC), field programmable gate array (FPGA), or other component, for example.

Conditional language used herein, such as, among others, "can," "could," "might," "may," "e.g.," and the like, unless specifically stated otherwise, or otherwise understood within the context as used, is generally intended to convey that certain embodiments include, while other embodiments do not include, certain features, elements and/or steps. Thus, such conditional language is not generally intended to imply that features, elements, and/or steps are in any way required for one or more embodiments or that one or more embodiments necessarily include logic for deciding, with or without other input or prompting, whether these features, elements, and/or steps are included or are to be performed in any particular embodiment. The terms "comprising," "including," "having," and the like are synonymous and are used inclusively, in an open-ended fashion, and do not exclude additional elements, features, acts, operations, and so forth. Also, the term "or" is used in its inclusive sense (and not in its exclusive sense) so that when used, for example, to connect a list of elements, the term "or" means one, some, or all of the elements in the list.

Disjunctive language such as the phrase "at least one of X, Y, Z," unless specifically stated otherwise, is understood with the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present.

As used in this disclosure, the term "a" or "one" may include one or more items unless specifically stated otherwise. Further, the phrase "based on" is intended to mean "based at least in part on" unless specifically stated otherwise.

What is claimed is:

1. A computer-implemented method, the method comprising:
    receiving first audio data including a first portion corresponding to a first frequency range, a second portion corresponding to a second frequency range higher than the first frequency range, and a third portion corresponding to a third frequency range higher than the second frequency range;
    determining a first value associated with the first portion;
    determining a second value associated with the second portion;
    determining a third value associated with the third portion;
    determining, using at least the first value and the third value, a first expected value associated with the second frequency range;
    determining, using the first expected value, that the second value satisfies a first condition;
    determining a first gain value corresponding to the second frequency range; and
    generating second audio data using the first audio data and the first gain value, the generating comprising attenuating at least a portion of the first audio data.

2. The computer-implemented method of claim 1, further comprising:
    determining a fourth value associated with a fourth portion of the first audio data that corresponds to a fourth frequency range higher than the third frequency range;
    determining, using at least the second value and the fourth value, a second expected value associated with the third frequency range;
    determining, using the second expected value, that the third value does not satisfy the first condition;
    determining a second gain value corresponding to the third frequency range, the second gain value having a value of one; and
    generating the second audio data using the first audio data, the first gain value, and the second gain value.

3. The computer-implemented method of claim 1, wherein determining the first value further comprises:
 determining, using a first audio frame of the first portion and an attack rate associated with a first envelope detector, a fourth value; and
 determining the first value using the fourth value, a second audio frame of the first portion, and a decay rate associated with the first envelope detector.

4. The computer-implemented method of claim 1, wherein determining the first expected value further comprises:
 determining the first expected value using a weighted average of at least the first value and the third value.

5. The computer-implemented method of claim 1, wherein determining the first expected value further comprises:
 determining a first plurality of frequency ranges lower than the second frequency range, the first plurality of frequency ranges including the first frequency range and a fourth frequency range;
 determining a fourth value associated with a fourth portion of the first audio data that corresponds to the fourth frequency range;
 determining a second plurality of frequency ranges higher than the second frequency range, the second plurality of frequency ranges including the third frequency range and a fifth frequency range;
 determining a fifth value associated with a fifth portion of the first audio data that corresponds to the fifth frequency range; and
 determining the first expected value using a weighted average of at least the first value, the third value, the fourth value, and the fifth value.

6. The computer-implemented method of claim 1, wherein determining that the second value satisfies the first condition further comprises:
 determining a fourth value by dividing the second value by the first expected value; and
 determining that the fourth value is greater than a first threshold value, the first threshold value corresponding to detection of feedback.

7. The computer-implemented method of claim 1, wherein determining that the second value satisfies the first condition further comprises:
 determining an average value of the second portion during a period of time;
 determining a second threshold value by multiplying the average value by a fifth value, the second threshold value corresponding to a cutoff value; and
 determining that the second value is greater than the second threshold value.

8. The computer-implemented method of claim 1, further comprising:
 in response to determining that the second value satisfies the first condition, setting, during a first time range, a first counter value associated with the second frequency range to a fourth value;
 determining, during a second time range after the first time range, a second counter value by decrementing the fourth value;
 determining that the second counter value is greater than zero; and
 setting the first gain value equal to an attenuation value.

9. The computer-implemented method of claim 8, further comprising:
 setting, prior to the second time range, a third counter value associated with the third frequency range to the fourth value;
 determining a fifth value associated with a fourth portion of the first audio data that corresponds to a fourth frequency range higher than the third frequency range;
 determining, using at least the second value and the fifth value, a second expected value associated with the third frequency range;
 determining, using the second expected value, that the third value does not satisfy the first condition;
 in response to determining that the third value does not satisfy the first condition, determining, during the second time range, a fourth counter value by decrementing the third counter value;
 determining that the fourth counter value is greater than zero;
 setting a second gain value corresponding to the third frequency range to the attenuation value; and
 generating the second audio data using the first audio data, the first gain value, and the second gain value.

10. The computer-implemented method of claim 1, further comprising:
 in response to determining that the second value satisfies the first condition, setting (i) a second gain value corresponding to the first frequency range to an attenuation value and (ii) a third gain value corresponding to the third frequency range to the attenuation value; and
 generating the second audio data using the first audio data, the first gain value, the second gain value, and the third gain value.

11. A system comprising:
 at least one processor; and
 memory including instructions operable to be executed by the at least one processor to cause the system to:
  receive first audio data including a first portion corresponding to a first frequency range, a second portion corresponding to a second frequency range higher than the first frequency range, and a third portion corresponding to a third frequency range higher than the second frequency range;
  determine a first value associated with the first portion;
  determine a second value associated with the second portion;
  determine a third value associated with the third portion;
  determine, using at least the first value and the third value, a first expected value associated with the second frequency range;
  determine, using the first expected value, that the second value satisfies a first condition;
  determine a first gain value corresponding to the second frequency range; and
  generate second audio data using the first audio data and the first gain value, the generating comprising attenuating at least a portion of the first audio data.

12. The system of claim 11, wherein the memory further comprises instructions that, when executed by the at least one processor, further cause the system to:
 determine a fourth value associated with a fourth portion of the first audio data that corresponds to a fourth frequency range higher than the third frequency range;
 determine, using at least the second value and the fourth value, a second expected value associated with the third frequency range;

determine, using the second expected value, that the third value does not satisfy the first condition;

determine a second gain value corresponding to the third frequency range, the second gain value having a value of one; and generate the second audio data using the first audio data, the first gain value, and the second gain value.

13. The system of claim 11, wherein the memory further comprises instructions that, when executed by the at least one processor, further cause the system to:

determine, using a first audio frame of the first portion and an attack rate associated with a first envelope detector, a fourth value; and determine the first value using the fourth value, a second audio frame of the first portion, and a decay rate associated with the first envelope detector.

14. The system of claim 11, wherein the memory further comprises instructions that, when executed by the at least one processor, further cause the system to:

determine the first expected value using a weighted average of at least the first value and the third value.

15. The system of claim 11, wherein the memory further comprises instructions that, when executed by the at least one processor, further cause the system to:

determine a first plurality of frequency ranges lower than the second frequency range, the first plurality of frequency ranges including the first frequency range and a fourth frequency range;

determine a fourth value associated with a fourth portion of the first audio data that corresponds to the fourth frequency range;

determine a second plurality of frequency ranges higher than the second frequency range, the second plurality of frequency ranges including the third frequency range and a fifth frequency range;

determine a fifth value associated with a fifth portion of the first audio data that corresponds to the fifth frequency range; and determine the first expected value using a weighted average of at least the first value, the third value, the fourth value, and the fifth value.

16. The system of claim 11, wherein the memory further comprises instructions that, when executed by the at least one processor, further cause the system to:

determine a fourth value by dividing the second value by the first expected value; and determine that the fourth value is greater than a first threshold value, the first threshold value corresponding to detection of feedback.

17. The system of claim 11, wherein the memory further comprises instructions that, when executed by the at least one processor, further cause the system to:

determine an average value of the second portion during a period of time;

determine a second threshold value by multiplying the average value by a fifth value, the second threshold value corresponding to a cutoff value; and determine that the second value is greater than the second threshold value.

18. The system of claim 11, wherein the memory further comprises instructions that, when executed by the at least one processor, further cause the system to:

in response to determining that the second value satisfies the first condition, set, during a first time range, a first counter value associated with the second frequency range to a fourth value;

determine, during a second time range after the first time range, a second counter value by decrementing the fourth value;

determine that the second counter value is greater than zero; and set the first gain value equal to an attenuation value.

19. The system of claim 18, wherein the memory further comprises instructions that, when executed by the at least one processor, further cause the system to:

set, prior to the second time range, a third counter value associated with the third frequency range to the fourth value;

determine a fifth value associated with a fourth portion of the first audio data that corresponds to a fourth frequency range higher than the third frequency range;

determine, using at least the second value and the fifth value, a second expected value associated with the third frequency range;

determine, using the second expected value, that the third value does not satisfy the first condition;

in response to determining that the third value does not satisfy the first condition, determine, during the second time range, a fourth counter value by decrementing the third counter value;

determine that the fourth counter value is greater than zero;

set a second gain value corresponding to the third frequency range to the attenuation value; and generate the second audio data using the first audio data, the first gain value, and the second gain value.

20. The system of claim 11, wherein the memory further comprises instructions that, when executed by the at least one processor, further cause the system to:

in response to determining that the second value satisfies the first condition, set (i) a second gain value corresponding to the first frequency range to an attenuation value and (ii) a third gain value corresponding to the third frequency range to the attenuation value; and generate the second audio data using the first audio data, the first gain value, the second gain value, and the third gain value.

* * * * *